US012772693B2

(12) United States Patent
Jeong

(10) Patent No.: US 12,772,693 B2
(45) Date of Patent: Oct. 20, 2026

(54) HYBRID ORGANIC LIGHT EMITTING DIODE DISPLAY PANEL AND METHOD OF MANUFACTURING THE SAME

(71) Applicant: Kyungpook National University Industry-Academic Cooperation Foundation, Daegu (KR)

(72) Inventor: Byoung-Seong Jeong, Suwon-si (KR)

(73) Assignee: Kyungpook National University Industry-Academic Cooperation Foundation, Daegu (KR)

( * ) Notice: Subject to any disclaimer, the term of this patent is extended or adjusted under 35 U.S.C. 154(b) by 339 days.

(21) Appl. No.: 18/697,733

(22) PCT Filed: Mar. 31, 2022

(86) PCT No.: PCT/KR2022/004573
§ 371 (c)(1),
(2) Date: Apr. 2, 2024

(87) PCT Pub. No.: WO2023/063510
PCT Pub. Date: Apr. 20, 2023

(65) Prior Publication Data

US 2025/0008809 A1 Jan. 2, 2025

(30) Foreign Application Priority Data

Oct. 15, 2021 (KR) ........................ 10-2021-0137322
Oct. 15, 2021 (KR) ........................ 10-2021-0137323
Oct. 15, 2021 (KR) ........................ 10-2021-0137324

(51) Int. Cl.
*H10K 59/60* (2023.01)
*H10K 59/12* (2023.01)
(Continued)

(52) U.S. Cl.
CPC ......... *H10K 59/60* (2023.02); *H10K 59/1201* (2023.02); *H10K 59/127* (2023.02); *H10K 59/878* (2023.02)

(58) Field of Classification Search
None
See application file for complete search history.

(56) References Cited

U.S. PATENT DOCUMENTS

2014/0225090 A1* 8/2014 Lee ........................ H10K 71/00 257/40
2015/0380476 A1 12/2015 Zhang et al.
(Continued)

FOREIGN PATENT DOCUMENTS

JP 2011-142289 A 7/2011
KR 10-0966258 B1 6/2010
(Continued)

OTHER PUBLICATIONS

Extended European Search Report in EP Patent Application No. 22881142.8 , dated Sep. 26, 2025, 10 pages.
(Continued)

*Primary Examiner* — Khaja Ahmad
(74) *Attorney, Agent, or Firm* — Park, Kim & Suh, LLC

(57) ABSTRACT

Disclosed are: a hybrid organic light-emitting diode (OLED) display panel and a method for manufacturing same. The hybrid OLED display panel according to an embodiment comprises: an OLED panel including a plurality of pixels arranged in a predetermined first array structure on a substrate, wherein each of the plurality of pixels includes a pixel light emitting part, and wherein the pixel light emitting part includes an OLED, a driving thin film transistor configured to drive the OLED, and a switching thin film transistor configured to switch the driving thin film transistor; and a solar cell including a plurality of pixel solar cells arranged in the first array structure to correspond to the plurality of
(Continued)

pixels on the substrate, wherein each of the plurality of pixel solar cells is disposed to correspond to the pixel light emitting part within a pixel area set as a pixel unit.

14 Claims, 25 Drawing Sheets

(51) Int. Cl.
*H10K 59/127* (2023.01)
*H10K 59/80* (2023.01)

(56) References Cited

U.S. PATENT DOCUMENTS

| | | | | |
|---|---|---|---|---|
| 2016/0343780 | A1 | 11/2016 | Guo et al. | |
| 2019/0363792 | A1 | 11/2019 | Tsonev et al. | |
| 2020/0023778 | A1 | 1/2020 | Park et al. | |
| 2020/0083302 | A1* | 3/2020 | Park | H10K 59/60 |
| 2021/0193769 | A1* | 6/2021 | Bok | G06F 1/1605 |
| 2021/0406502 | A1* | 12/2021 | You | G02F 1/13306 |

FOREIGN PATENT DOCUMENTS

| | | | |
|---|---|---|---|
| KR | 10-2011-0071446 | A | 6/2011 |
| KR | 10-1156434 | B1 | 6/2012 |
| KR | 10-1183967 | B1 | 9/2012 |
| KR | 10-1376751 | B1 | 3/2014 |
| KR | 10-2016-0050177 | A | 5/2016 |
| KR | 10-1651689 | B1 | 8/2016 |
| KR | 10-2017-0023282 | A | 3/2017 |
| KR | 10-2018-0016198 | A | 2/2018 |
| KR | 10-2020-0029103 | A | 3/2020 |
| KR | 10-2140674 | B1 | 8/2020 |
| KR | 10-2020-0111401 | A | 9/2020 |
| KR | 10-2205073 | B1 | 1/2021 |
| KR | 10-2021-0085129 | A | 7/2021 |
| KR | 10-2021-0086164 | A | 7/2021 |

OTHER PUBLICATIONS

International Search Report in International Application No. PCT/KR2022/004573, dated Jul. 18, 2022, 2pages.

* cited by examiner

100

HYBRID ORGANIC LIGHT EMITTING DIODE DISPLAY PANEL AND METHOD OF MANUFACTURING THE SAME

CROSS-REFERENCE TO RELATED APPLICATIONS

This application is the National Stage filing under 35 U.S.C. 371 of International Application No. PCT/KR2022/004573, filed on Mar. 31, 2022, which claims the benefit of Korean Patent Application No. 10-2021-0137322, filed on Oct. 15, 2021, Korean Patent Application No. 10-2021-0137323, filed on Oct. 15, 2021, and Korean Patent Application No. 10-2021-0137324, filed on Oct. 15, 2021, the contents of which are all hereby incorporated by reference herein in their entirety.

TECHNICAL FIELD

The present disclosure relates to an organic light emitting diode (OLED) display panel and a method of manufacturing the same, and more particularly, to a hybrid OLED display panel in which a solar cell is directly embedded inside a display panel in units of pixels, and a method of manufacturing the same.

BACKGROUND ART

An organic light emitting diode (OLED) display is a display device implemented using an OLED made of an organic compound that emits a light in response to an electric current. Further, the OLED display is spotlighted because the display does not require a backlight device, has a light expression range that is wider than that of a liquid crystal display (LCD), has excellent color reproduction, and is freely deformed due to a small thickness thereof. In an OLED display according to the related art, power should be separately supplied from an external unit or power should be supplied using a separate embedded battery to drive a display panel, and power efficiency of the OLED display is reaching a limit thereof.

DETAILED DESCRIPTION OF THE INVENTION

Technical Problem

An aspect of the present disclosure provides a hybrid organic light emitting diode (OLED) display panel which itself has solar cells embedded in units of pixels in a display panel, thus enabling both viewing the display panel and charging power from solar energy, and a method of manufacturing the same.

Further, another aspect of the present disclosure provides a transparent OLED display panel that may include a pixel-transparent window in a pixel layout to implement a window-type transparent display panel having high transmittance, and a method of manufacturing the same.

Further, still another aspect of the present disclosure provides an OLED display panel that may include a pixel mirror window in the pixel layout to implement a mirror display panel, and a method of manufacturing the same.

Technical Solution

According to an embodiment of the present disclosure, a hybrid organic light emitting diode (OLED) display panel comprises an OLED panel including a plurality of pixels arranged in a predetermined first array structure on a substrate, wherein each of the plurality of pixels includes a pixel light emitting part, and wherein the pixel light emitting part includes an OLED, a driving thin film transistor configured to drive the OLED, and a switching thin film transistor configured to switch the driving thin film transistor; and a solar cell including a plurality of pixel solar cells arranged in the first array structure to correspond to the plurality of pixels on the substrate, wherein each of the plurality of pixel solar cells is disposed to correspond to the pixel light emitting part within a pixel area set as a pixel unit.

According to an embodiment, the plurality of pixel light emitting parts and the plurality of pixel solar cells provided in the plurality of pixels may be arranged to have the same array period.

According to an embodiment, the pixel light emitting part may be disposed in a first area within the pixel area, and the pixel solar cell may be disposed in a second area corresponding to a corner area within the pixel area. The second area may be an area that does not overlap with the first area on a plane of the hybrid OLED display panel.

According to an embodiment, the driving thin film transistor may include a first channel layer on the substrate, a first gate layer formed to be insulated on the first channel layer, and a first drain electrode and a first source electrode electrically connected to the first channel layer.

According to an embodiment, the pixel solar cell may include a first electrode layer on the substrate, a first semiconductor layer laminated on the first electrode layer, a second semiconductor layer laminated on the first semiconductor layer in a heterojunction structure, and a second electrode layer laminated on the second semiconductor layer.

According to an embodiment, the switching thin film transistor may include a second channel layer on the substrate, a second gate layer formed to be insulated on the second channel layer, and a second drain electrode and a second source electrode electrically connected to the second channel layer.

According to an embodiment, the first channel layer and the first semiconductor layer may be made of the same first semiconductor material corresponding to a first type that is one of an N-type and a P-type. The second channel layer and the second semiconductor layer may be made of the same second semiconductor material corresponding to a second type that is the other one of the N-type and the P-type.

According to an embodiment, the hybrid OLED display panel may further comprise a transparent window including a plurality of pixel-transparent windows arranged in the first array structure to correspond to the plurality of pixels on the substrate, wherein each of the plurality of pixel-transparent windows is disposed in a one-to-one correspondence with the pixel light emitting part within the pixel area.

According to an embodiment, the plurality of pixel light emitting parts and the plurality of pixel-transparent windows may be arranged to have the same array period, and the pixel-transparent window may be disposed in a third area within the pixel area. The third area may be an area that does not overlap with the first area and the second area on a plane of the hybrid OLED display panel.

According to an embodiment, the driving thin film transistor further may include a first insulating layer laminated on the first channel layer, a first interlayer insulating layer covering the first gate layer, a second insulating layer laminated on the first interlayer insulating layer, and a second interlayer insulating layer formed on the second insulating layer.

According to an embodiment, the second channel layer may be laminated on the first interlayer insulating layer, the second gate layer may be formed on the second insulating layer, and the second interlayer insulating layer may cover the second gate layer.

According to an embodiment, the pixel-transparent window may include a first transparent insulating layer laminated on the substrate, a first transparent interlayer insulating layer laminated on the first transparent insulating layer, a second transparent insulating layer laminated on the first transparent interlayer insulating layer, and a second transparent interlayer insulating layer laminated on the second transparent insulating layer.

According to an embodiment, the first insulating layer and the first transparent insulating layer may be made of the same first insulating material, the second insulating layer and the second transparent insulating layer may be made of the same second insulating material, the first interlayer insulating layer and the first transparent interlayer insulating layer may be made of the same third insulating material, and the second interlayer insulating layer and the second transparent interlayer insulating layer may be made of the same fourth insulating material.

According to an embodiment, the hybrid OLED display panel may further comprise a mirror window including a plurality of pixel mirror windows made of a reflective material and arranged in the first array structure to correspond to the plurality of pixels on the substrate, wherein each of the plurality of pixel mirror windows is disposed in a one-to-one correspondence with the pixel light emitting part within the pixel area.

According to an embodiment, the plurality of pixel light emitting parts and the plurality of pixel mirror windows may be arranged to have the same array period, and the pixel mirror window may be disposed in a fourth area within the pixel area. The fourth area may be an area that does not overlap with the first area and the second area on a plane of the hybrid OLED display panel.

According to an embodiment of the present disclosure, a method of manufacturing a hybrid OLED display panel comprises forming an OLED panel including a plurality of pixels arranged in a first array structure on a substrate; and forming a solar cell including a plurality of pixel solar cells arranged in the first array structure to correspond to the plurality of pixels on the substrate.

According to an embodiment, the forming of the OLED panel may include forming the OLED panel to include a pixel light emitting part for each of the plurality of pixels, wherein the pixel light emitting part includes an OLED, a driving thin film transistor configured to drive the OLED, and a switching thin film transistor configured to switch the driving thin film transistor.

According to an embodiment, the forming of the solar cell may include forming the solar cell to dispose each of the plurality of pixel solar cells in a one-to-one correspondence with the pixel light emitting part within a pixel area set as a pixel unit.

According to an embodiment, the forming of the OLED panel may include forming the driving thin film transistor on the substrate.

According to an embodiment, the forming of the driving thin film transistor may include laminating a first channel layer on the substrate; forming a first gate layer to be insulated on the first channel layer; and forming a first drain electrode and a first source electrode to be electrically connected to the first channel layer.

According to an embodiment, the forming of the solar cell may include laminating a first electrode layer on the substrate; laminating a first semiconductor layer on the first electrode layer; laminating a second semiconductor layer on the first semiconductor layer in a heterojunction structure; and laminating a second electrode layer on the second semiconductor layer.

According to an embodiment, the forming of the OLED panel further may include forming the switching thin film transistor on the substrate. The forming of the switching thin film transistor may include laminating a second channel layer on the substrate; forming a second gate layer to be insulated on the second channel layer; and forming a second drain electrode and a second source electrode to be electrically connected to the second channel layer.

According to an embodiment, the laminating of the first channel layer and the laminating of the first semiconductor layer may be simultaneously performed, and the laminating of the second channel layer and the laminating of the second semiconductor layer may be simultaneously performed.

According to an embodiment, the method may further include forming a transparent window to dispose each of a plurality of pixel-transparent windows in a one-to-one correspondence with the pixel light emitting part within the pixel area, and wherein the plurality of pixel-transparent windows are arranged in the first array structure to correspond to the plurality of pixels on the substrate.

According to an embodiment, the forming of the driving thin film transistor further may include laminating a first insulating layer on the first channel layer; laminating a first interlayer insulating layer covering the first gate layer; laminating a second insulating layer on the first interlayer insulating layer; and laminating a second interlayer insulating layer on the second insulating layer.

According to an embodiment, the forming of the transparent window may include laminating a first transparent insulating layer on the substrate; laminating a first transparent interlayer insulating layer on the first transparent insulating layer; laminating a second transparent insulating layer on the first transparent interlayer insulating layer; and laminating a second transparent interlayer insulating layer on the second transparent insulating layer.

According to an embodiment, the laminating of the first insulating layer and the laminating of the first transparent insulating layer may be simultaneously performed, the laminating of the second insulating layer and the laminating of the second transparent insulating layer may be simultaneously performed, the laminating of the first interlayer insulating layer and the laminating of the first transparent interlayer insulating layer may be simultaneously performed, and the laminating of the second interlayer insulating layer and the laminating of the second transparent interlayer insulating layer may be simultaneously performed.

According to an embodiment, the method may further include forming a mirror window made of a reflective material to dispose each of a plurality of pixel mirror windows in a one-to-one correspondence with the pixel light emitting part within the pixel area, wherein the plurality of pixel mirror windows are arranged in the first array structure to correspond to the plurality of pixels on the substrate.

Advantageous Effects of the Invention

According to an embodiment of the present disclosure, a solar cell itself is embedded in units of pixels in a display panel, thus enabling both viewing the display panel and charging power from solar energy, and accordingly, energy efficiency of an OLED display panel may be maximized.

Further, according to an embodiment of the present disclosure, there is provided a transparent OLED display panel that may include a pixel-transparent window in a pixel layout to implement a window-type transparent display panel having high transmittance, and a method of manufacturing the same.

Further, according to an embodiment of the present disclosure, there is provided a mirror-type OLED display panel that may include a pixel mirror window in the pixel layout to implement a mirror display panel, and a method of manufacturing the same.

BEST MODE

Figure 1:
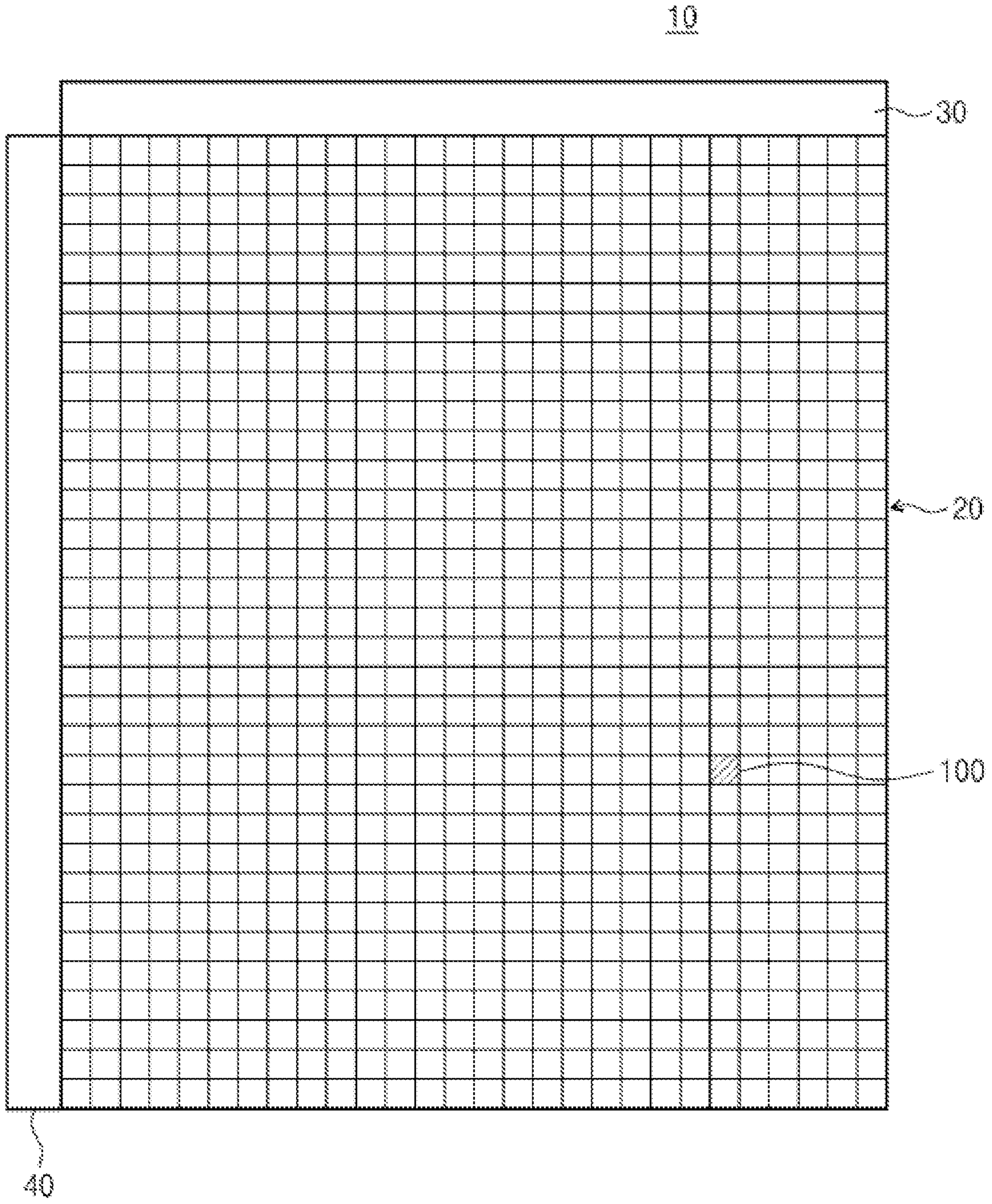
FIG. 1 is a schematic plan view of a hybrid organic light emitting diode (OLED) display panel according to an embodiment of the present disclosure.

Hereinafter, embodiments of the present disclosure will be described in more detail with reference to the accompanying drawings. The embodiments of the present disclosure may be modified into various forms, and the scope of the present disclosure should not be construed to be limited to the following embodiments. The embodiments of the present disclosure are provided to more completely describe the present disclosure for those skilled in the art. Thus, the shapes of the components of the drawings are exaggerated to emphasize a clearer description thereof.

It should be noted in advance that a configuration of the present disclosure for clarifying the solution of the problem to be solved by the present disclosure will be described in detail with reference to the accompanying drawings based on an embodiment of the present disclosure, the same reference numerals are assigned to the same components even though the components are in different drawings in assigning reference numerals to components of the drawings, and components in other drawings may be cited when necessary in the description of the drawings.

Meanwhile, directional terms such as an upper side, a lower side, an one side, and the other side are used in relation to orientation of the accompanying drawings. Since the components of the embodiment of the present disclosure may be positioned in various orientations, the directional terms are used for illustrative purposes and do not limit the positions thereof.

Further, terms such as first and second may be used to describe various elements, but the elements should not be limited by the terms. The terms may be used for the purpose of distinguishing one element from another element. For example, while not deviating from the scope of the present disclosure, a first element may be named a second element, and similarly, the second element may be named the first element.

Figure 2:
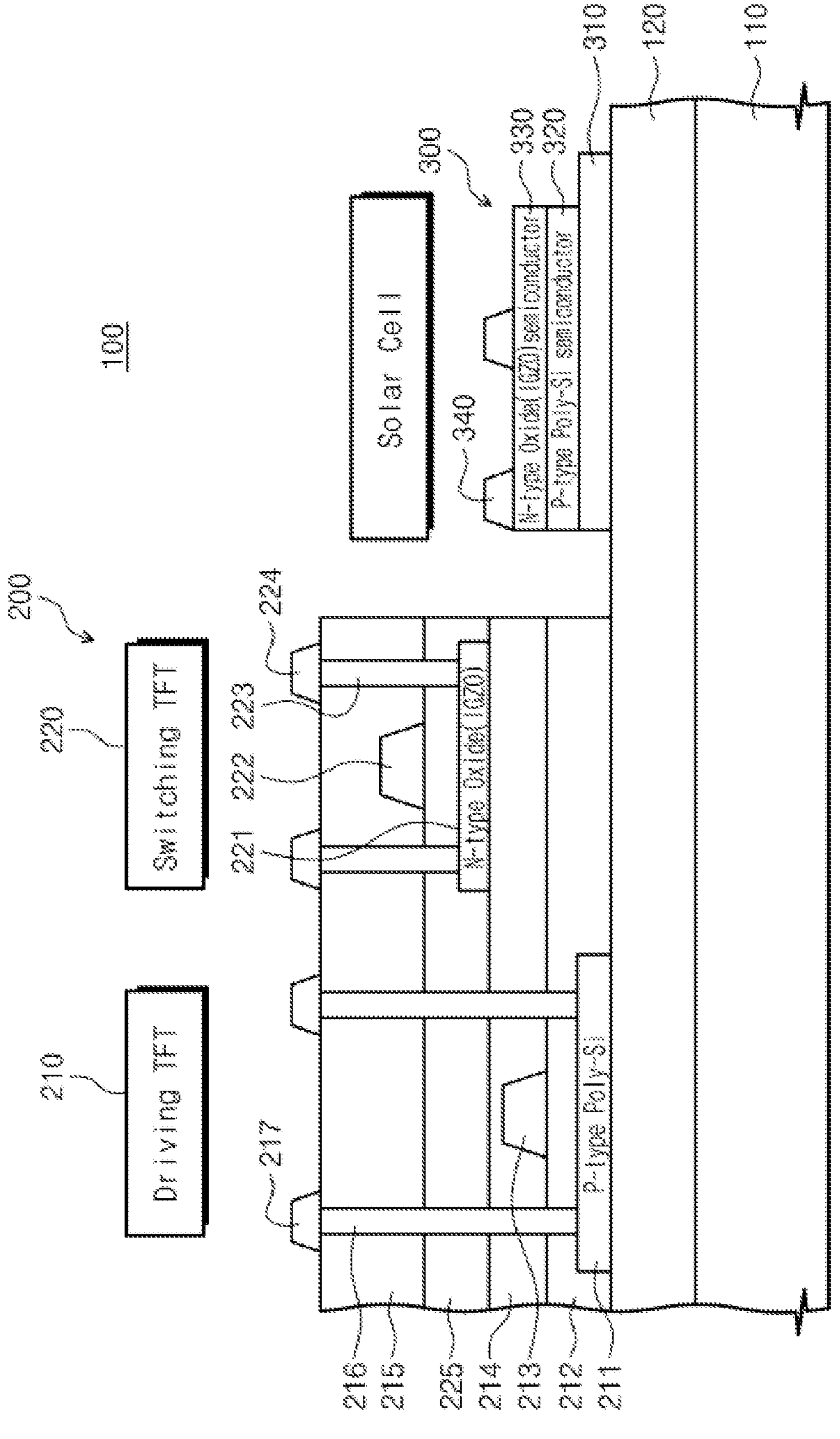
FIG. 2 is a schematic cross-sectional view illustrating a single pixel constituting the hybrid OLED display panel according to the embodiment of the present disclosure.
Figure 3:
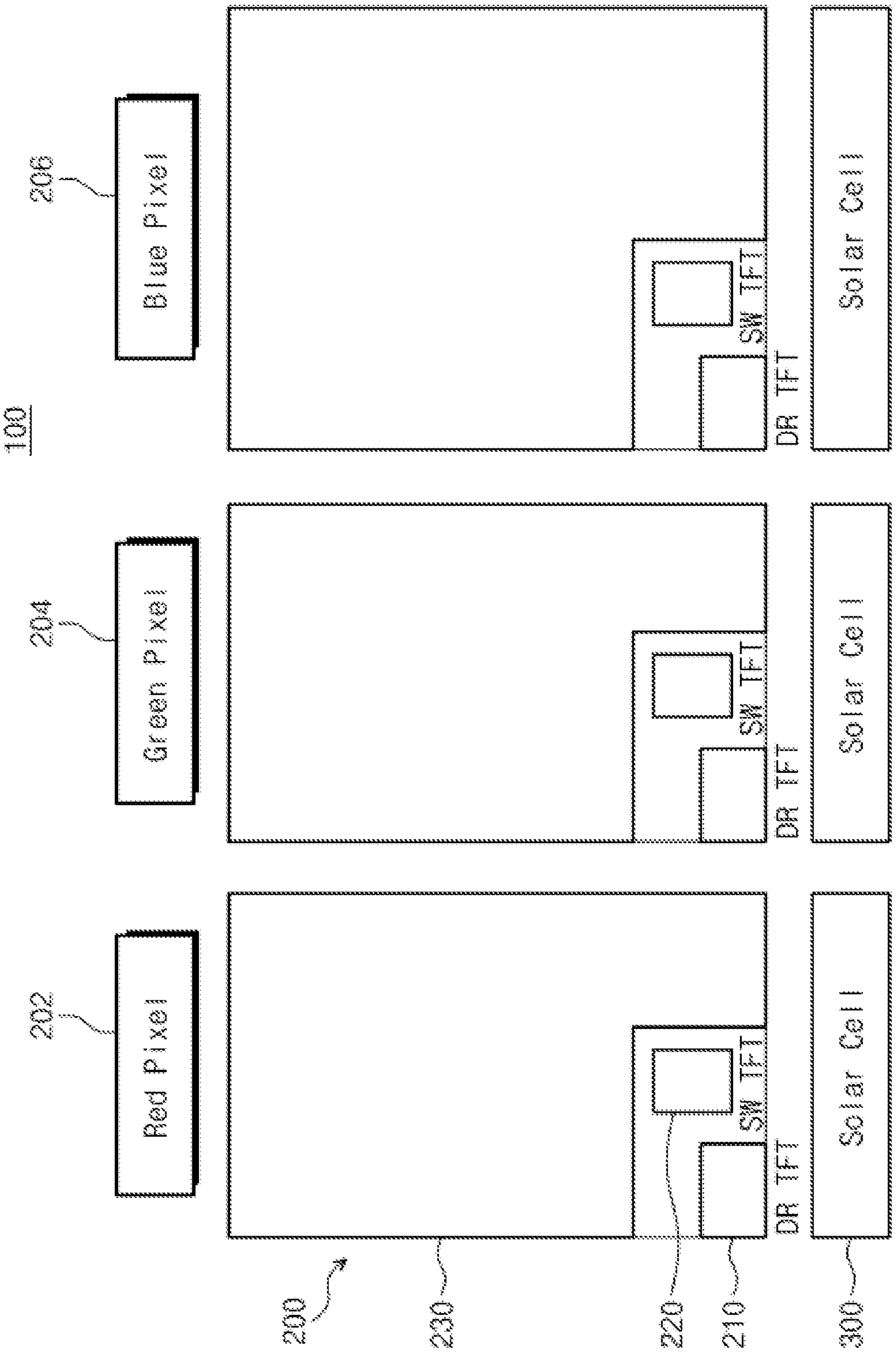
FIG. 3 is a schematic plan view illustrating the single pixel constituting the hybrid OLED display panel according to the embodiment of the present disclosure.

FIG. 1 is a schematic plan view of a hybrid organic light emitting diode (OLED) display panel according to an embodiment of the present disclosure. FIG. 2 is a schematic cross-sectional view illustrating a single pixel constituting the hybrid OLED display panel according to the embodiment of the present disclosure. FIG. 3 is a schematic plan view illustrating the single pixel constituting the hybrid OLED display panel according to the embodiment of the present disclosure.

Referring to FIGS. 1 to 3, a hybrid OLED display panel 10 according to the embodiment of the present disclosure may include an OLED panel 20 in which a plurality of pixels 100 are arranged on a substrate 110 in a predetermined first array structure, controllers 30 and 40 for controlling a driving thin film transistor and a switching thin film transistor provided in the plurality of pixels 100 of the OLED panel 20, and a solar cell in which a pixel solar cell 300 is disposed at each of the pixels 100 on the substrate 110.

In the OLED panel 20, a pixel light emitting part 200 may be provided at each of the pixels 100. In the embodiment, the pixel light emitting part 200 may include a red light emitting pixel 202, a green light emitting pixel 204, and a blue light emitting pixel 206. Detailed descriptions of configurations well known in the art related to the pixel light emitting part 200 will be omitted.

The pixel light emitting part 200 may include an OLED 230, a driving thin film transistor 210 that drives the OLED 230, and a switching thin film transistor 220 that switches the driving thin film transistor 210.

The plurality of pixel solar cells 300 may be arranged in the same first array structure as that of the plurality of pixel light emitting parts 200 to correspond to the plurality of pixels 100 on the substrate 110. The first array structure may be a matrix structure in which components are arranged in a plurality of row units and a plurality of column units.

Each of the pixel solar cells 300 may be disposed in a one-to-one correspondence with the pixel light emitting part 200 within a pixel area that is set as a pixel unit. The plurality of pixel light emitting parts 200 and the plurality of pixel solar cells 300 that are provided in the plurality of pixels 100 may be arranged to have the same array period.

The pixel light emitting part 200 may be disposed in a first area within the pixel area corresponding to a single pixel. The pixel solar cell 300 may be disposed in a second area corresponding to a corner area within the pixel area that is set as the pixel unit. The second area in which the pixel solar cell 300 is disposed may be an area that does not overlap the first area in which the pixel light emitting part 200 is formed on a plane of the hybrid OLED display panel 10, and may be, for example, a lower end of or an area adjacent to R/G/B pixels.

The driving thin film transistor 210 may include a first channel layer 211 and a first insulating layer 212 that are formed on the substrate 110 and a buffer layer 120 on the substrate 110, a first gate layer 213 that is formed to be insulated on the first channel layer 211, a first interlayer insulating layer 214 that covers the first gate layer 213, an insulating layer 215 that is formed on the first interlayer insulating layer 214, and first drain/source electrodes 216 and 217 that are electrically connected to the first channel layer 211.

The substrate 110 may be, for example, a glass substrate or a polyimide substrate, but the present disclosure is not limited thereto. The buffer layer 120 may be made of a material such as $SiN_x$, $SiO_x$, and $SiON_x$, but the present disclosure is not limited thereto. The buffer layer 120 may be variously implemented as a single buffer layer, a double buffer layer, or a triple or more buffer layer.

The switching thin film transistor 220 may include a second channel layer 221 that is formed on the substrate 110 and the buffer layer 120 on the substrate 110, an insulating layer 225 that is formed on the second channel layer 221, a second gate layer 222 that is formed on the insulating layer 225 to be insulated from the second channel layer 221, and second drain/source electrodes 223 and 224 that are electrically connected to the second channel layer 221.

The pixel solar cell 300 may include a first electrode layer 310 that is laminated on the substrate 110, a first semiconductor layer 320 laminated on the first electrode layer 310, a second semiconductor layer 330 laminated on the first semiconductor layer 320 in a heterojunction structure, and a second electrode layer 340 laminated on the second semiconductor layer 330. A metal electrode, such as Ti and Mo, which is stable even when the metal electrode is annealed at a temperature of about 450° C. after subjected to excimer laser annealing (ELA) crystallization may be used as the first electrode layer 310.

The first channel layer 211 of the driving thin film transistor 210 and the first semiconductor layer 320 of the pixel solar cell 300 that constitute the pixel light emitting part 200 may be made of the same first semiconductor material corresponding to a first type that is one of N-type and P-type. In the illustrated example, the first channel layer 211 and the first semiconductor layer 320 are made of a P-type polycrystalline silicon semiconductor material doped with B, Al, Ga, or the like.

The second channel layer 221 of the driving thin film transistor 210 and the second semiconductor layer 330 of the pixel solar cell 300 that constitute the pixel light emitting part 200 may be made of the same second semiconductor material corresponding to a second type that is the other one of N-type and P-type. In the illustrated example, the second channel layer 221 and the second semiconductor layer 330 may be made of an N-type IGZO oxide semiconductor material.

For example, an N-type semiconductor layer may be formed by sputtering a-IGZO material having In:Ga:Zn=1:1:1. For example, the P-type semiconductor layer may be made of a boron-doped a-Si material and may be formed by a method of forming a film using a chemical vapor deposition (CVD) manner and then implanting a doping material or a method of treating the a-Si material using an ELA manner and then doping the a-Si material with a boron.

Figure 4:
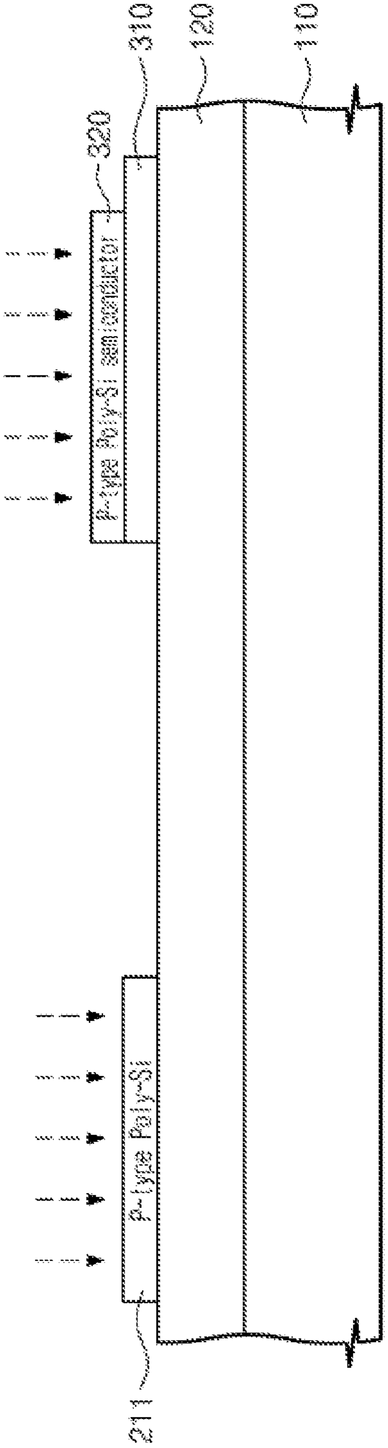
FIGS. 4 and 5 are views for describing a method of manufacturing the hybrid OLED display panel according to the embodiment of the present disclosure.
Figure 5:
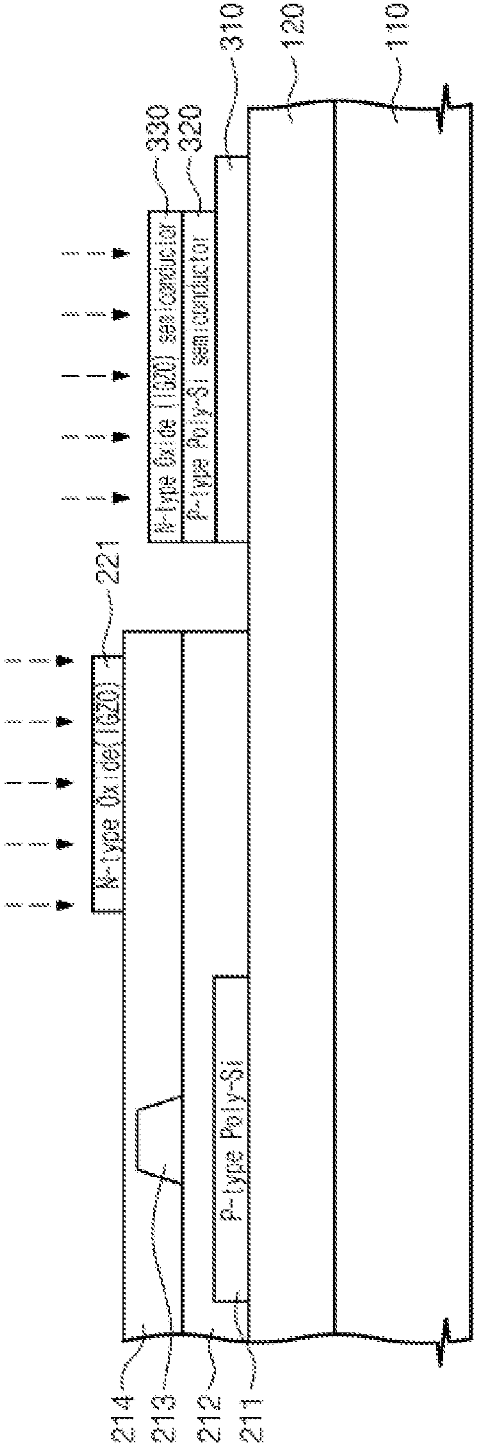

FIGS. 4 and 5 are views for describing a method of manufacturing the hybrid OLED display panel according to the embodiment of the present disclosure. First, referring to FIG. 4, after the first electrode layer 310 of the pixel solar cell 300 is laminated on the substrate 110 and the buffer layer 120, an operation of laminating the first channel layer 211 of the pixel light emitting part 200 and an operation of laminating the first semiconductor layer 320 on the first electrode layer 310 of the pixel solar cell 300 may be simultaneously performed.

Referring to FIG. 5, after the first channel layer 211, the first insulating layer 212, the first gate layer 213, and the first interlayer insulating layer 214 of the pixel light emitting part 200 are laminated on the substrate 110, an operation of laminating the second channel layer 221 of the pixel light emitting part 200 and an operation of laminating the second semiconductor layer 330 on the first semiconductor layer 320 of the pixel solar cell 300 may be performed simultaneously.

In this case, the same material used for the two channel layers that are semiconductor layers of the driving thin film transistor 210 and the switching thin film transistor 220 of the pixel light emitting part 200 may be applied as an N-type semiconductor material and a P-type semiconductor material of the pixel solar cell 300 so as to form a hybrid P-N junction. Meanwhile, the second electrode layer 340 corresponding to an upper electrode of the pixel solar cell 300 may be patterned simultaneously while the drain/source electrodes of the driving thin film transistor 210 and the switching thin film transistor 220 are formed, thereby achieving process simplification.

In this way, by patterning the pixel solar cell 300 simultaneously with the patterning process of the driving thin film transistor 210 and the switching thin film transistor 220 in the pixel light emitting part 200, the first channel layer 211 of the pixel light emitting part 200 and the first semiconductor layer 320 of the pixel solar cell 300 may be formed simultaneously, and the second channel layer 221 of the pixel light emitting part 200 and the second semiconductor layer 330 of the pixel solar cell 300 may be formed simultaneously, consequently, the process for forming the pixel solar cell 300 may be simplified, and process costs and time may be reduced.

The embodiment in which the switching thin film transistor 220 is formed after the driving thin film transistor 210 is formed has been described above. However, the driving thin film transistor 210 may be formed after the switching thin film transistor 220 is first formed or the driving thin film transistor 210 and the switching thin film transistor 220 may be formed simultaneously.

Figure 6:
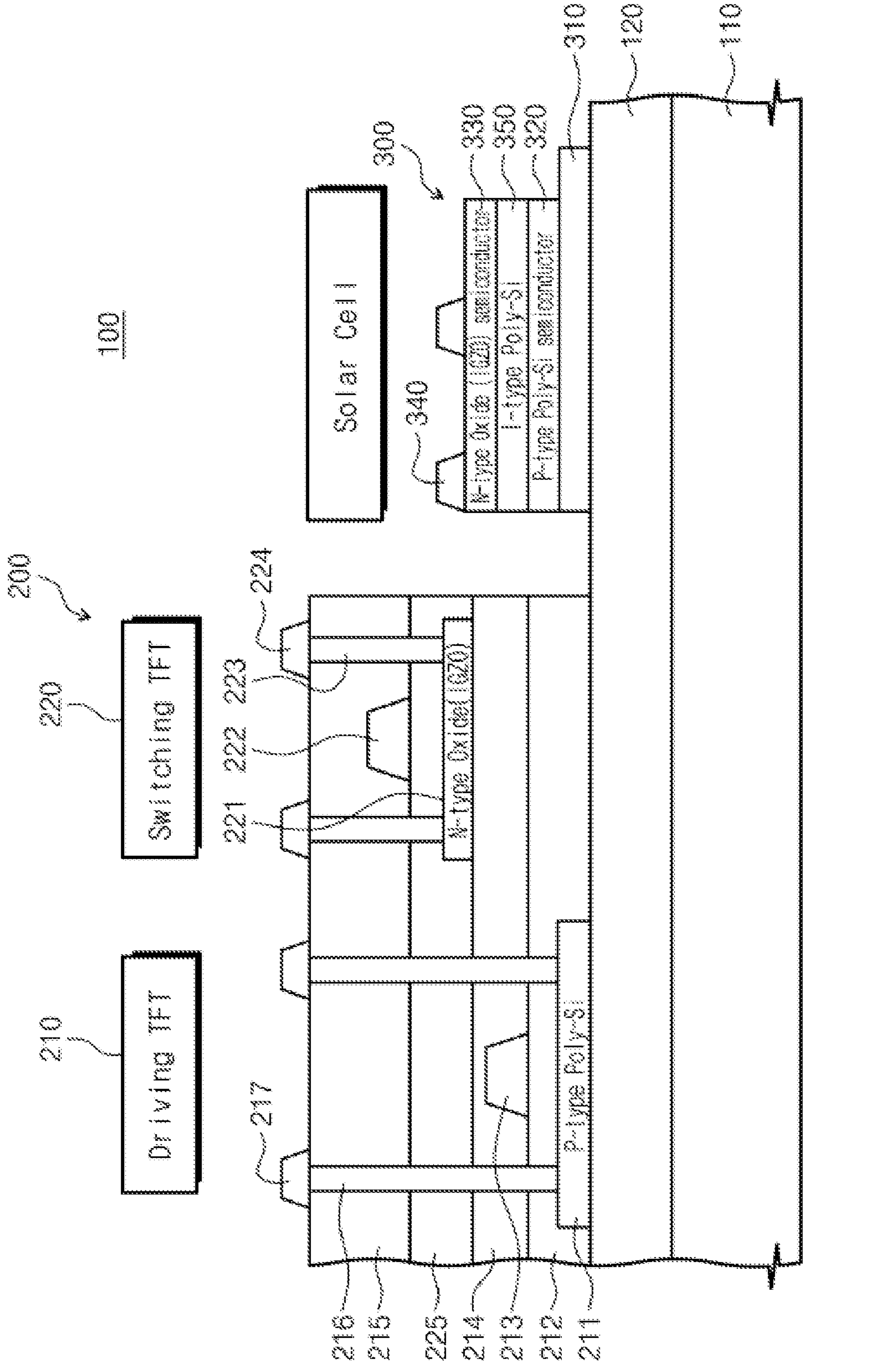
FIG. 6 is a cross-sectional view of a unit pixel of a hybrid OLED display panel according to another embodiment of the present disclosure.

FIG. 6 is a cross-sectional view of a unit pixel of a hybrid OLED display panel according to another embodiment of the present disclosure. The embodiment illustrated in FIG. 6 differs from the above-described embodiment in that the pixel solar cell 300 has an N-i-P heterojunction structure by an intrinsic poly-silicon layer 350 formed between the first semiconductor layer 320 and the second semiconductor layer 330 of the pixel solar cell 300.

Figure 7:
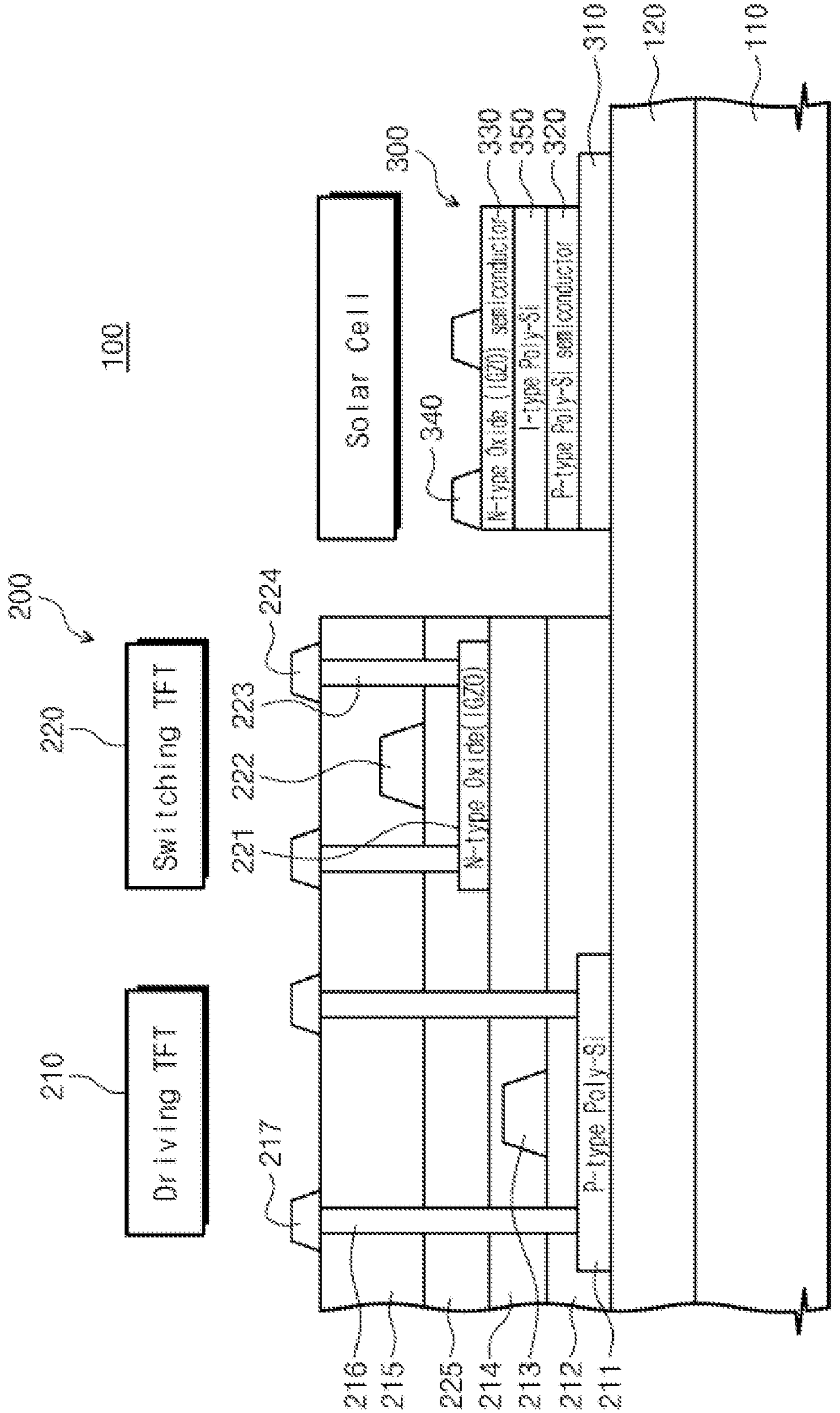
FIGS. 7 and 8 are cross-sectional views of a unit pixel of a hybrid OLED display panel according to various embodiments of the present disclosure.
Figure 8:
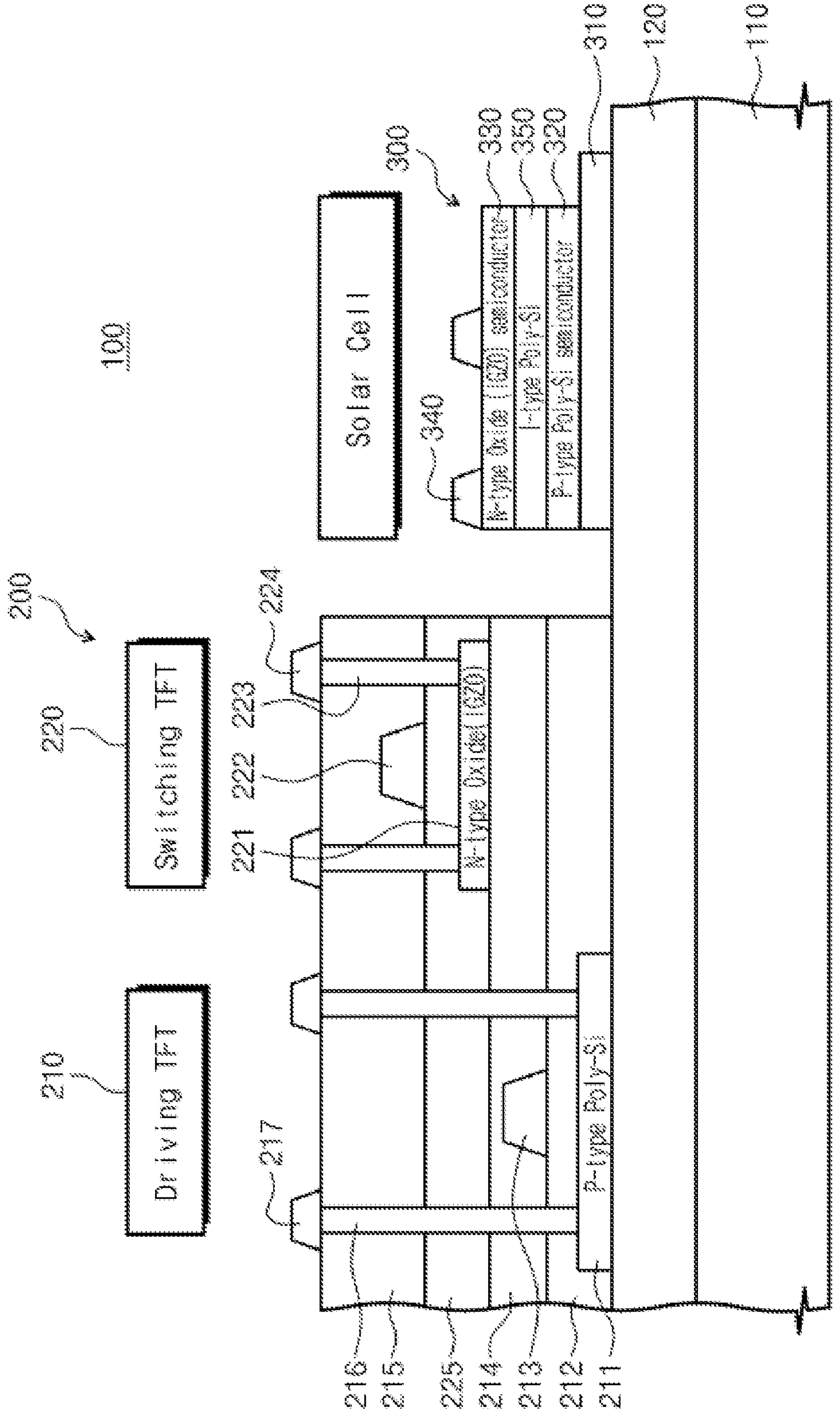

FIGS. 7 and 8 are cross-sectional views of a unit pixel of a hybrid OLED display panel according to various embodiments of the present disclosure. The embodiment illustrated in FIG. 7 differs from the above-described embodiments in that both the second channel layer 221 and the second semiconductor layer 330 are made of an N-type poly-silicon semiconductor material and thus the pixel solar cell 300 has an N-i-P homojunction structure. The embodiment illustrated in FIG. 8 differs from the above-described embodiments in that both the first channel layer 211 and the first semiconductor layer 320 are made of a P-type oxide semiconductor material and thus the pixel solar cell 300 has an oxide P-i-N homojunction structure.

Figure 9:
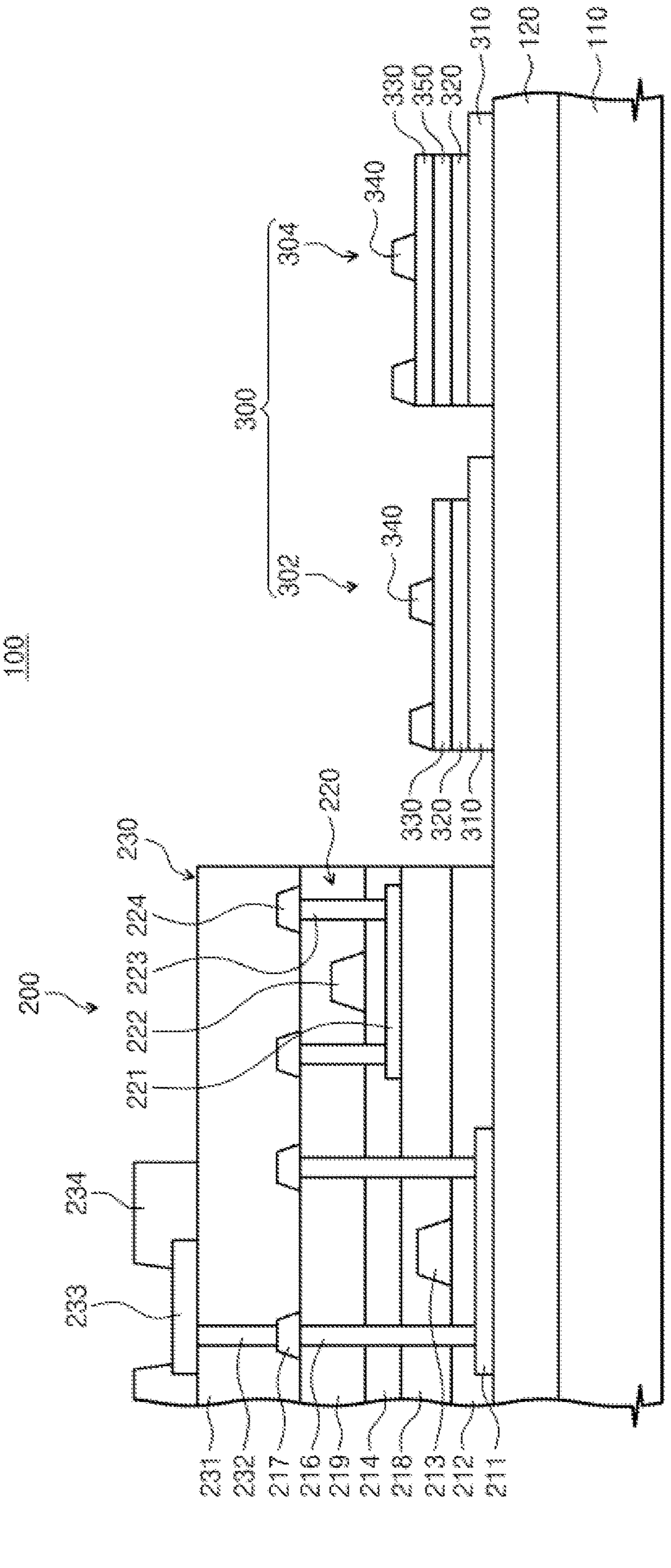
FIG. 9 is a cross-sectional view of a unit pixel of a hybrid OLED display panel according to still another embodiment of the present disclosure.

FIG. 9 is a cross-sectional view of a unit pixel of a hybrid OLED display panel according to still another embodiment of the present disclosure. The embodiment illustrated in FIG. 9 differs from the above-described embodiments in that the pixel solar cell 300 has a plurality of pixel solar cells including a first pixel solar cell 302 and a second pixel solar cell 304. Since the first pixel solar cell 302 and the second pixel solar cell 304 are the same as the pixel solar cells illustrated in FIGS. 2 and 6, respectively, duplicated descriptions thereof will be omitted.

The OLED 230 constituting the pixel light emitting part 200 may include a flattening layer 231 that is formed on the driving thin film transistor 210 and the switching thin film transistor 220, pixel electrodes 232 and 233 that are connected to a first drain electrode or a first source electrode of the driving thin film transistor 210, and a pixel defining layer 234 that is formed on the flattening layer 231.

Figure 10:
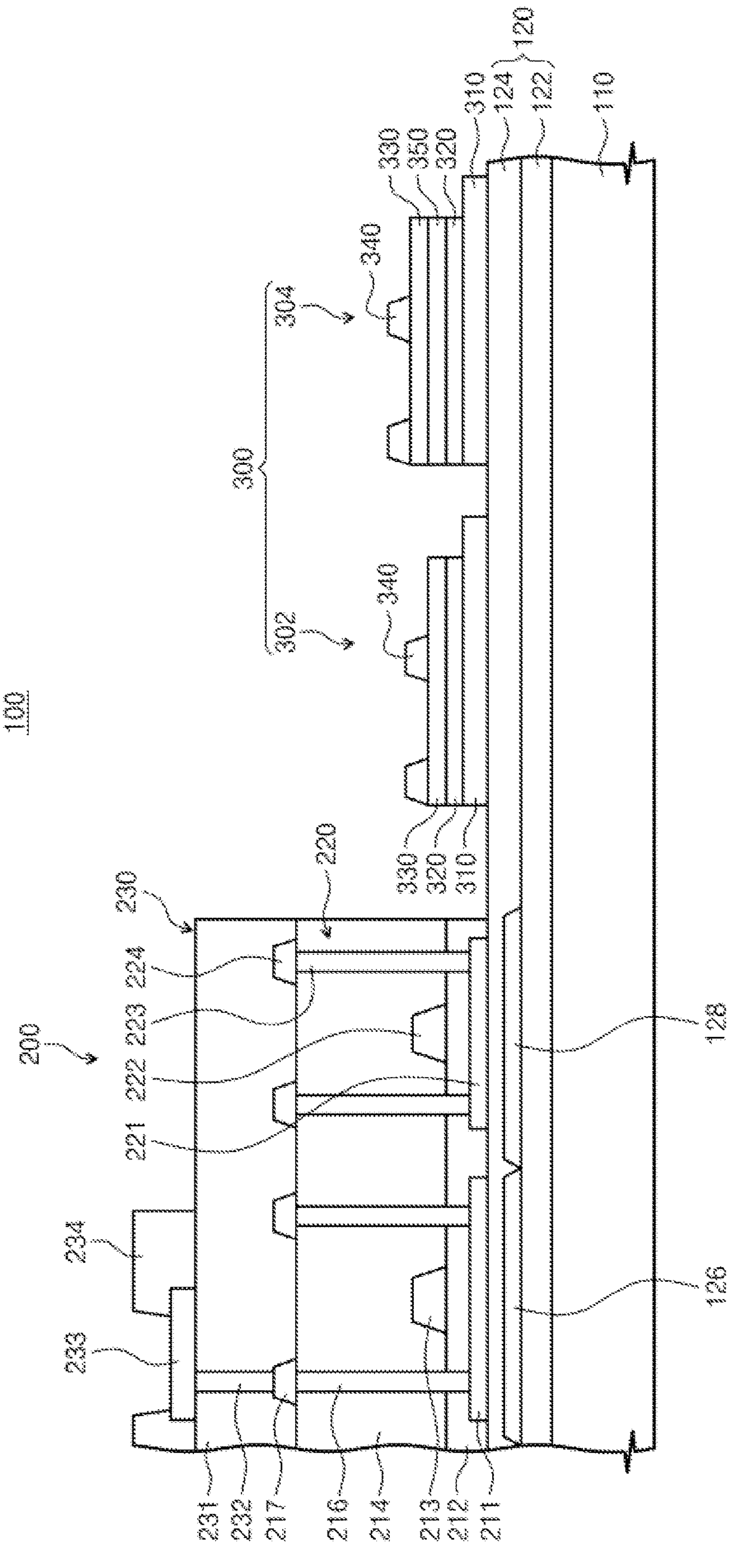
FIG. 10 is a cross-sectional view of a unit pixel of a hybrid OLED display panel according to yet another embodiment of the present disclosure.

FIG. 10 is a cross-sectional view of a unit pixel of a hybrid OLED display panel according to yet another embodiment of the present disclosure. The embodiment illustrated in FIG. 10 differs from the above-described embodiments in that the buffer layer 120 includes a first buffer layer 122 and a second buffer layer 124 that are laminated on each other, the driving thin film transistor 210 further includes a first blocking metal layer 126 on the first buffer layer 122, and the switching thin film transistor 220 further includes a second blocking metal layer 128 on the first buffer layer 122.

In the above-described embodiments, one of the channel layer of the driving thin film transistor 210 and the channel layer of the switching thin film transistor 220 may be made of a P-type semiconductor material, and the other one thereof may be made of an N-type semiconductor material. Further, in the pixel solar cell 300, one of the plurality of semiconductor layers that are vertically laminated may be made of a P-type semiconductor material, and the other one thereof may be made of an N-type semiconductor material.

Figure 11:
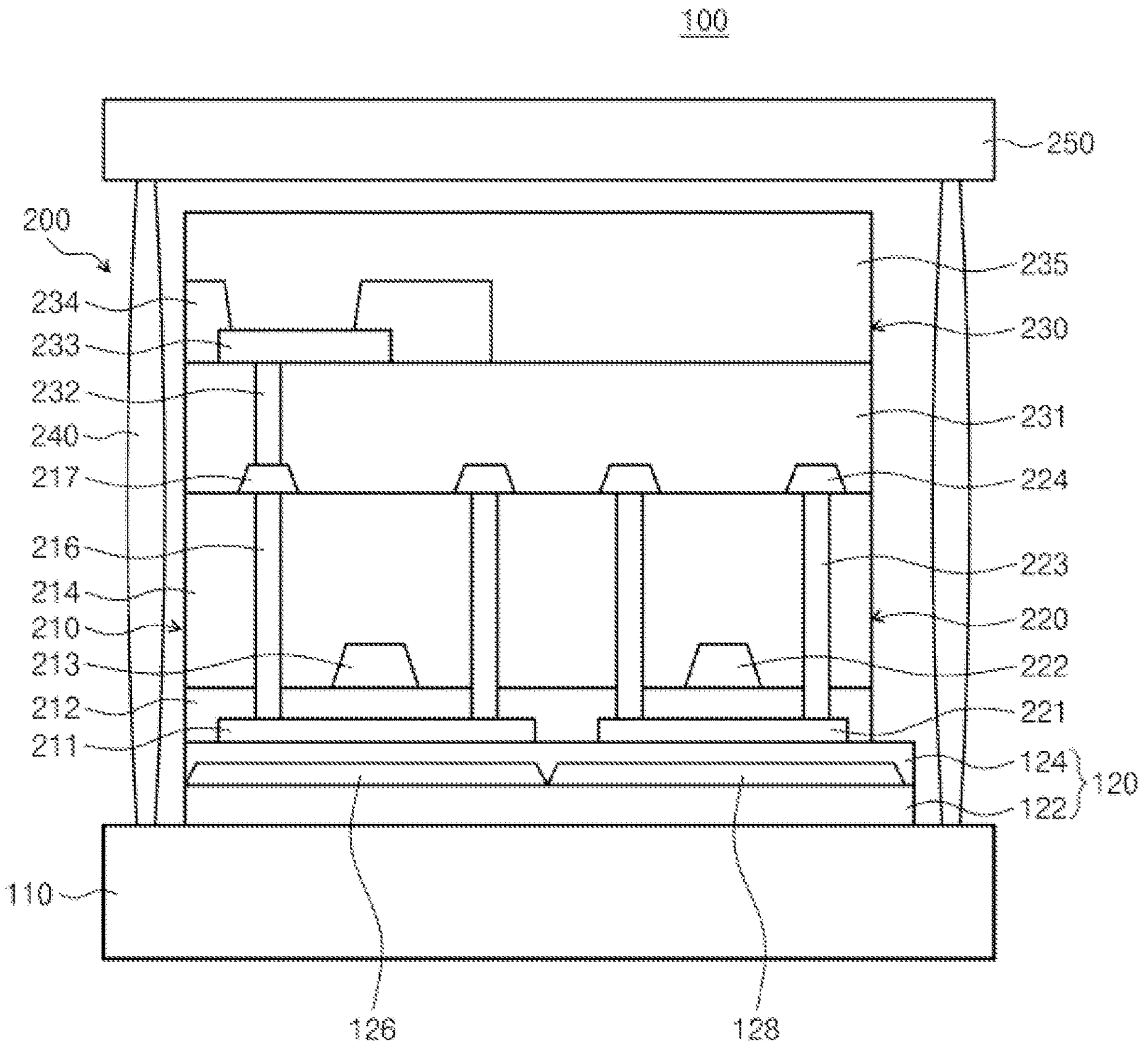
FIG. 11 is a cross-sectional view of a pixel light emitting part constituting the hybrid OLED display panel according to yet another embodiment of the present disclosure.

FIG. 11 is a cross-sectional view of a pixel light emitting part constituting the hybrid OLED display panel according to yet another embodiment of the present disclosure. In the embodiment illustrated in FIG. 11, each pixel unit has a glass encapsulation structure in which a side surface between the substrate 110 corresponding to a lower substrate and an upper substrate 250 is sealed by a sealing part 240 made of a sealant. For example, a glass or polyimide substrate may be used as the upper substrate 250.

An OLED light emitting layer 235 may be formed on the flattening layer 231 An upper electrode for applying power or ground, for example, a cathode electrode or an anode electrode, may be formed on the light emitting layer 235. For example, the flattening layer 231 may be made of an OC organic film such as polyimide (PI) or polyamide (PA) or an inorganic film.

Figure 12:
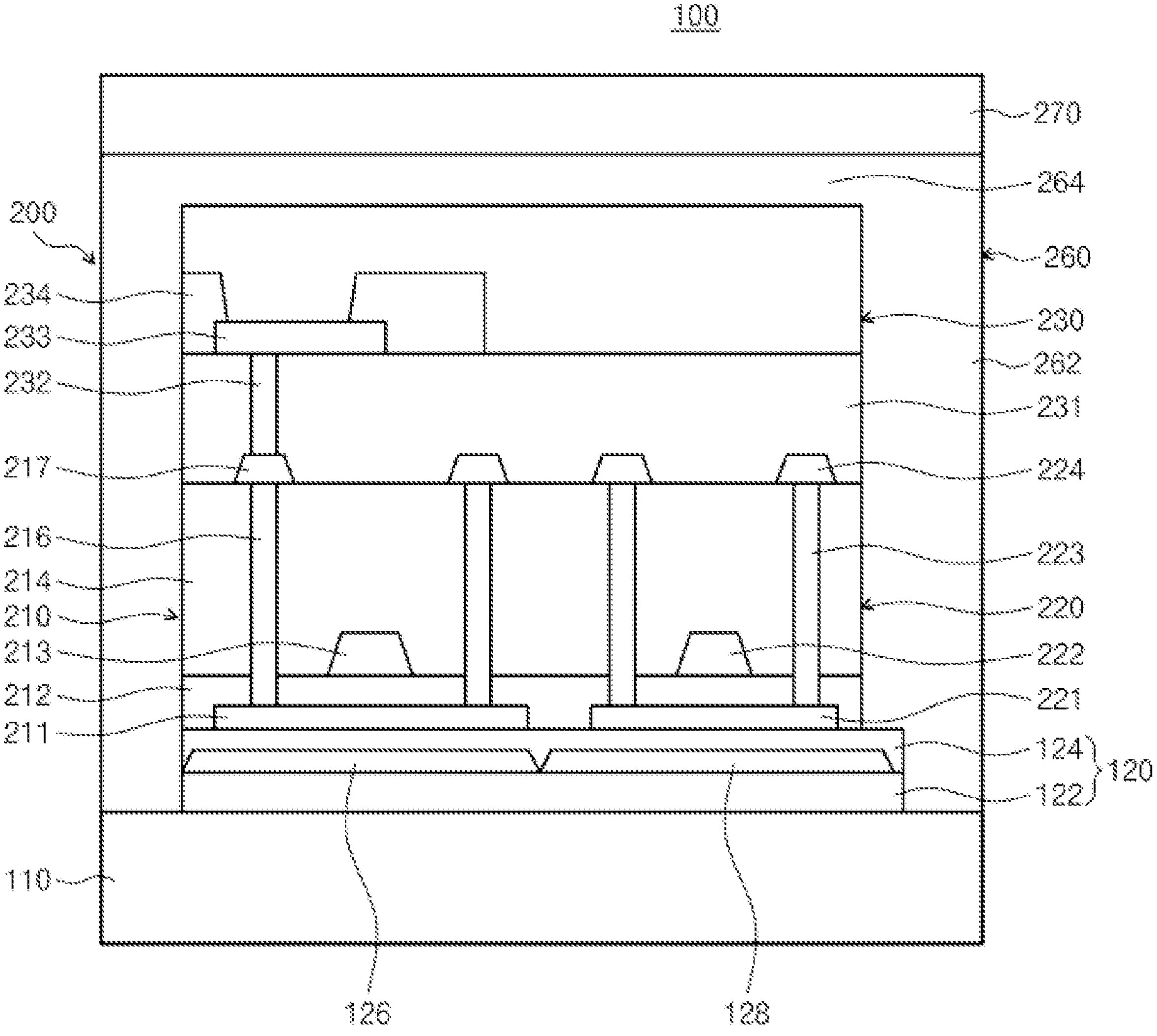
FIG. 12 is a cross-sectional view of the pixel light emitting part constituting the hybrid OLED display panel according to yet another embodiment of the present disclosure.

FIG. 12 is a cross-sectional view of the pixel light emitting part constituting the hybrid OLED display panel according to yet another embodiment of the present disclosure. In the embodiment illustrated in FIG. 12, each pixel unit has a structure in which an encapsulation part 260 includes a side thin film encapsulation structure 262 that encapsulates a side surface of the pixel light emitting part 200 and an upper thin film encapsulation structure 264 that encapsulates an upper surface of the pixel light emitting part 200, thus the encapsulation part 260 suppresses external moisture permeation, and a protective window layer 270 is formed on the encapsulation part 260. For example, the encapsulation part 260 may have a thin film encapsulation structure of an inorganic film/monomer/inorganic film.

Figure 13:
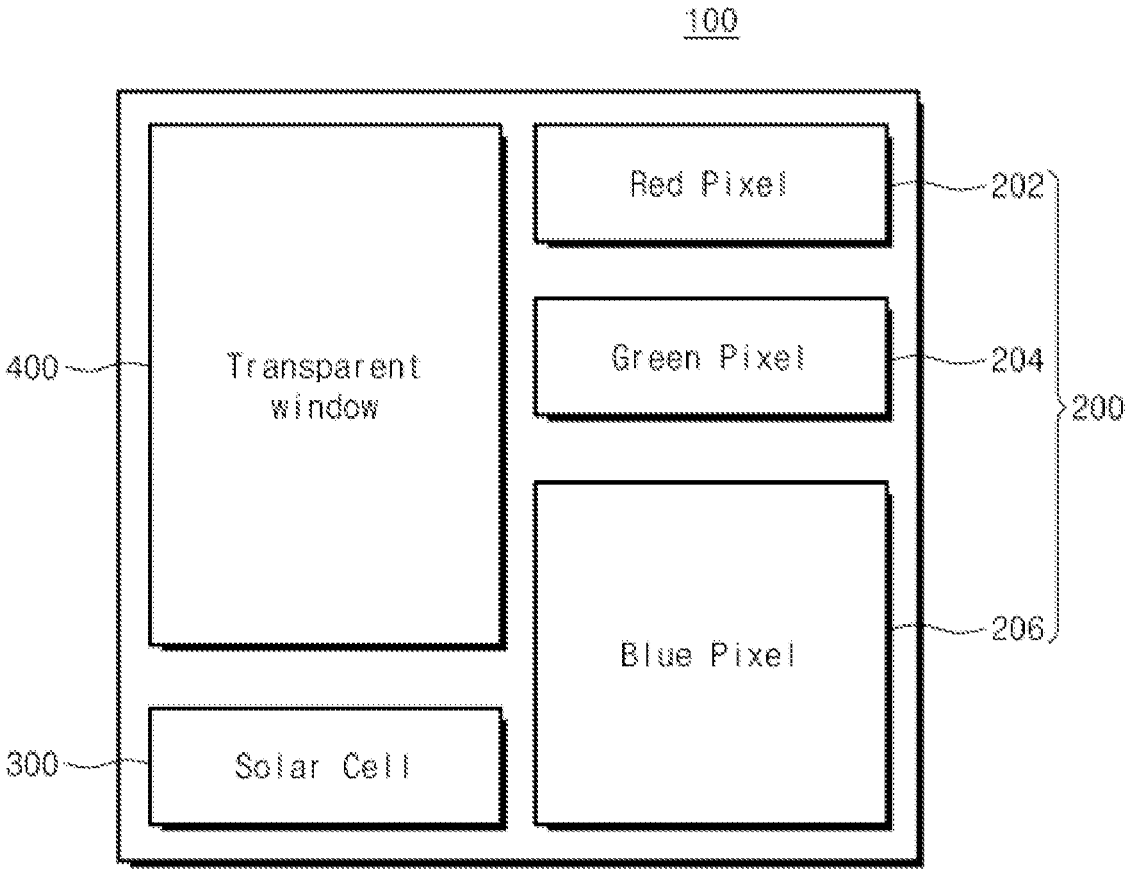
FIG. 13 is a schematic plan view illustrating a single pixel constituting the hybrid OLED display panel according to yet another embodiment of the present disclosure.
Figure 14:
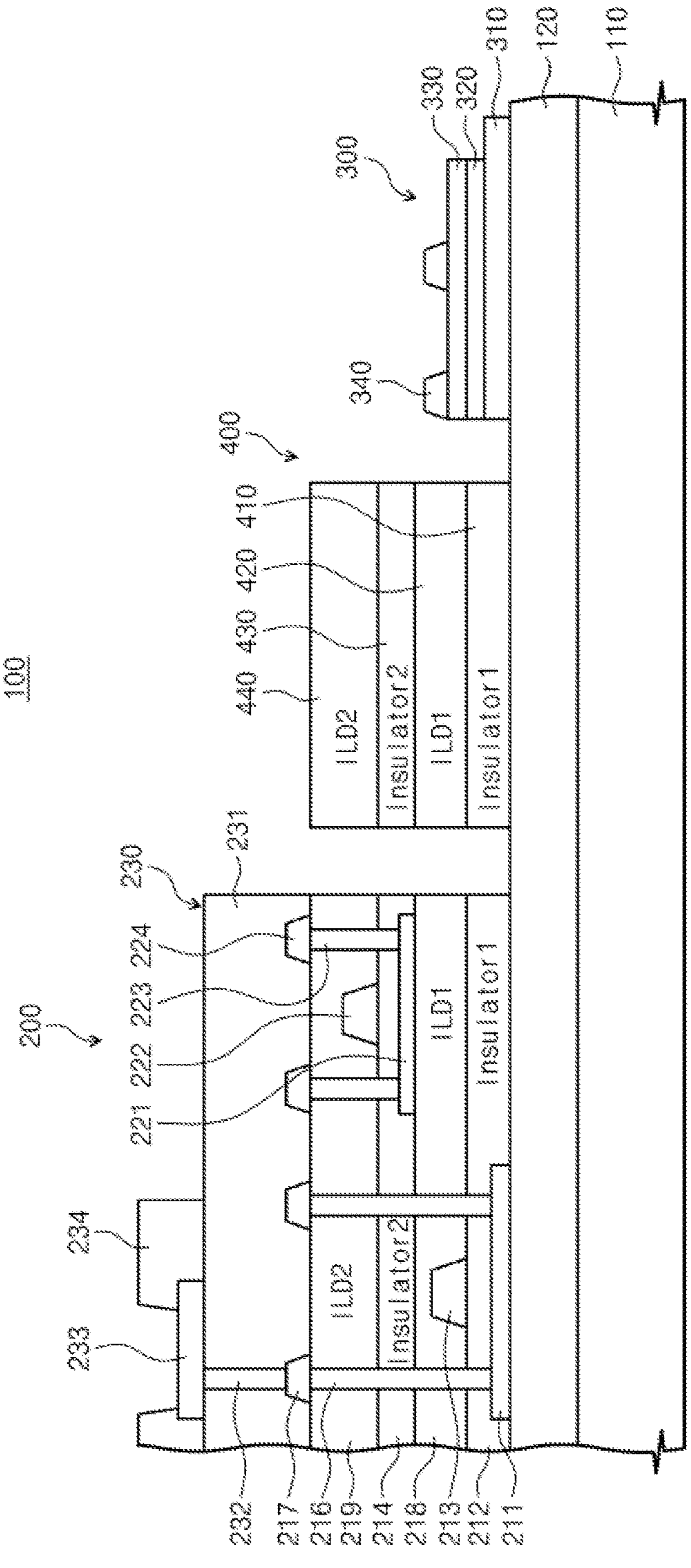
FIG. 14 is a cross-sectional view of the single pixel of the hybrid OLED display panel according to the embodiment of FIG. 13.
Figure 15:
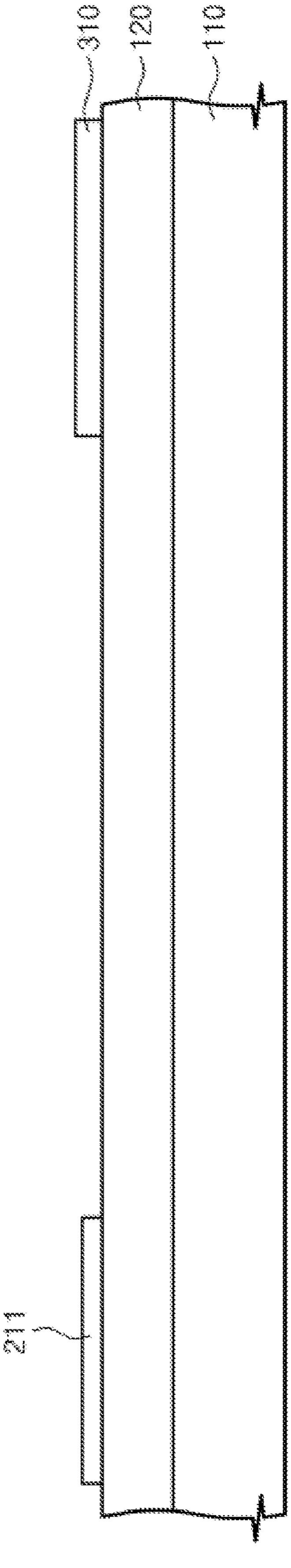
FIGS. 15 to 20 are views for describing a method of manufacturing the hybrid OLED display panel according to the embodiment illustrated in FIG. 14.

FIG. 13 is a schematic plan view illustrating a single pixel constituting the hybrid OLED display panel according to yet another embodiment of the present disclosure. FIG. 14 is a cross-sectional view of the single pixel of the hybrid OLED display panel according to the embodiment of FIG. 13. Referring to FIGS. 13 and 14, the hybrid OLED display panel according to yet another embodiment of the present disclosure differs from the above-described embodiments in that the hybrid OLED display panel further includes a transparent window including a plurality of pixel-transparent windows 400. Since the pixel light emitting part 200 and the pixel solar cell 300 have been described in the above-described embodiments, a duplicated description thereof will be omitted, and the pixel-transparent window 400 will be mainly described.

The plurality of pixel-transparent windows 400 may be arranged in the same first array structure as that of the pixel light emitting parts 200 to correspond to the plurality of pixels 100 on the substrate 110. Each of the pixel-transparent windows 400 may be arranged in a one-to-one correspondence with the pixel light emitting part 200 within the pixel area defined as the pixel unit. The plurality of pixel light emitting parts 200 and the plurality of pixel-transparent windows 400 may be arranged to have the same array period.

The pixel-transparent window 400 may be disposed in a third area within the pixel area defined as the pixel unit. The third area in which the pixel-transparent window 400 is disposed may be an area that does not overlap the first area in which the pixel light emitting part 200 is disposed and the second area in which the pixel solar cell 300 is disposed, on a plane of the hybrid OLED display panel. A transmittance of the pixel-transparent window 400 may be improved by etching and removing all remaining metal films except for the inorganic film.

The driving thin film transistor 210 may further include a first interlayer insulating layer 218 that covers the first gate layer 213, a second insulating layer 214 that is laminated on the first interlayer insulating layer 218, and a second interlayer insulating layer 219 that is formed on the second insulating layer 214. The second channel layer 221 may be laminated on the first interlayer insulating layer 218, the second gate layer 222 may be formed on the second insulating layer 214, and the second interlayer insulating layer 219 may cover the second gate layer 222.

The pixel-transparent window 400 may include a first transparent insulating layer 410 that is laminated on the substrate 110 and the buffer layer 120, a first transparent interlayer insulating layer 420 that is laminated on the first transparent insulating layer 410, a second transparent insulating layer 430 laminated on the first transparent interlayer insulating layer 420, and a second transparent interlayer insulating layer 440 that is laminated on the second transparent insulating layer 430.

The first transparent insulating layer 410, the first transparent interlayer insulating layer 420, the second transparent insulating layer 430, and the second transparent interlayer insulating layer 440 may be independently formed as a single film of $SiO_x$, $SiN_x$, or $SiON_x$, a double layer obtained by combining $SiO_x$, $SiN_x$, and/or $SiON_x$ (e.g., $SiO_x/SiN_x$, $SiN_x/SiO_x$, $SiON_x/SiN_x$ or the like), or a triple layer (e.g., $SiN_x/SiO_x/SiN_x$, $SiO_x/SiN_x/SiO_x$, $SiON_x/SiO_x/SiN_x$ or other combinations).

The first insulating layer 212 of the driving thin film transistor 210 and the first transparent insulating layer 410 of the pixel-transparent window 400 may be made of the same first insulating material. The second insulating layer 214 of the pixel light emitting part 200 and the second transparent insulating layer 430 may be made of the same second insulating material.

The first interlayer insulating layer 218 of the pixel light emitting part 200 and the first transparent interlayer insulating layer 420 of the pixel-transparent window 400 may be made of the same third insulating material. Further, the second interlayer insulating layer 219 of the pixel light emitting part 200 and the second transparent interlayer insulating layer 440 of the pixel-transparent window 400 may be made of the same fourth insulating material.

FIGS. 15 to 20 are views for describing a method of manufacturing the hybrid OLED display panel according to the embodiment illustrated in FIG. 14. First, referring to FIG. 15, after the first electrode layer 310 of the pixel solar cell 300 is laminated on the substrate 110 and the buffer layer 120, an operation of laminating the first channel layer 211 of the pixel light emitting part 200 and an operation of laminating the first semiconductor layer 320 on the first electrode layer 310 of the pixel solar cell 300 may be simultaneously performed.

Figure 16:
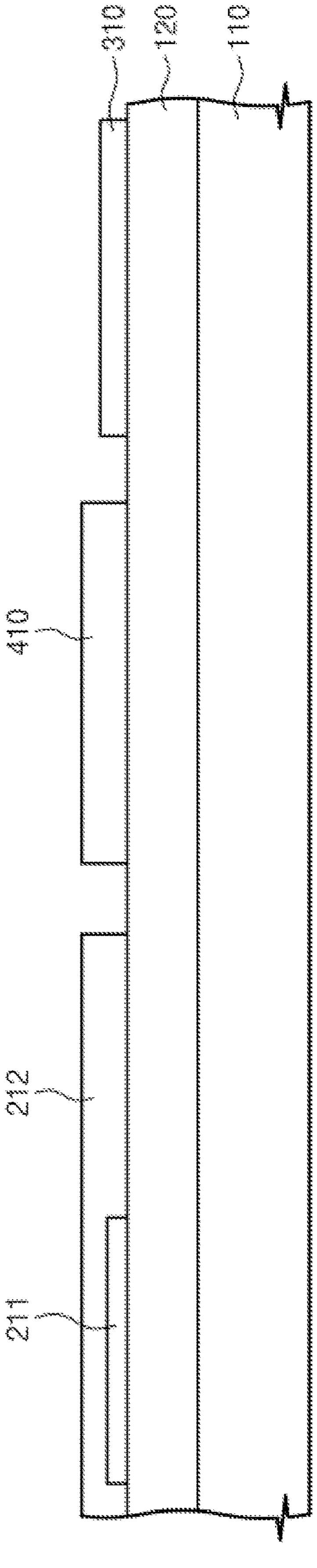
Figure 17:
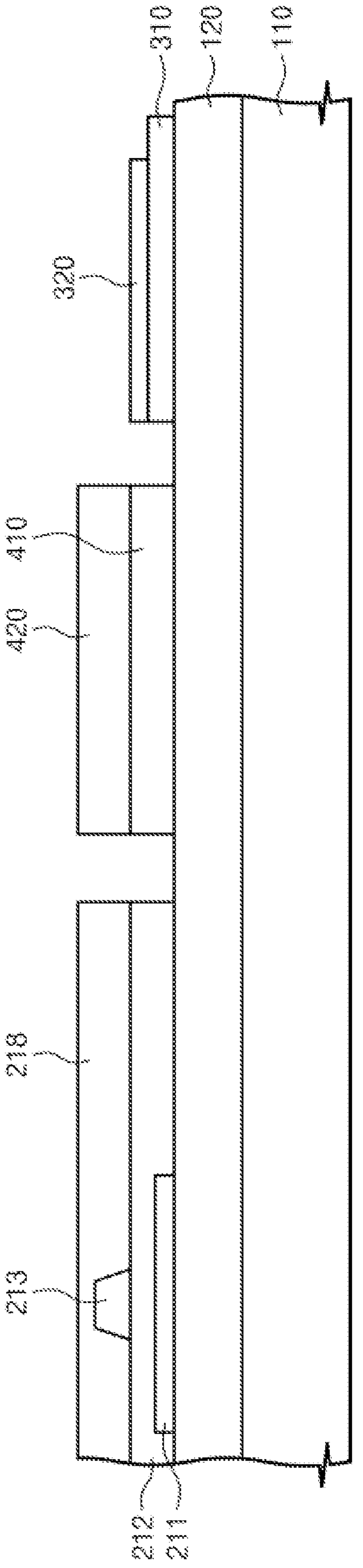

Referring to FIG. 16, an operation of laminating the first insulating layer 212, which covers the first channel layer 211, on the substrate 110 and the buffer layer 120 and an operation of laminating the first transparent insulating layer 410 of the pixel-transparent window 400 may be simultaneously performed. Further, referring to FIG. 17, an operation of laminating the first interlayer insulating layer 218 on the first insulating layer 212 of the pixel light emitting part 200 and an operation of laminating the first transparent interlayer insulating layer 420 on the first transparent insulating layer 410 of the pixel-transparent window 400 may be simultaneously performed.

Figure 18:
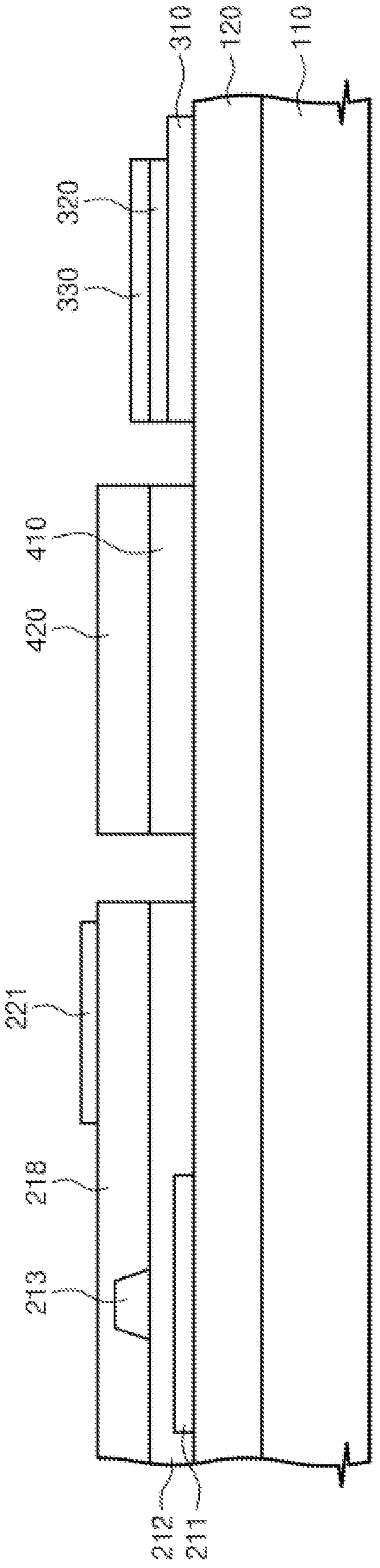
Figure 19:
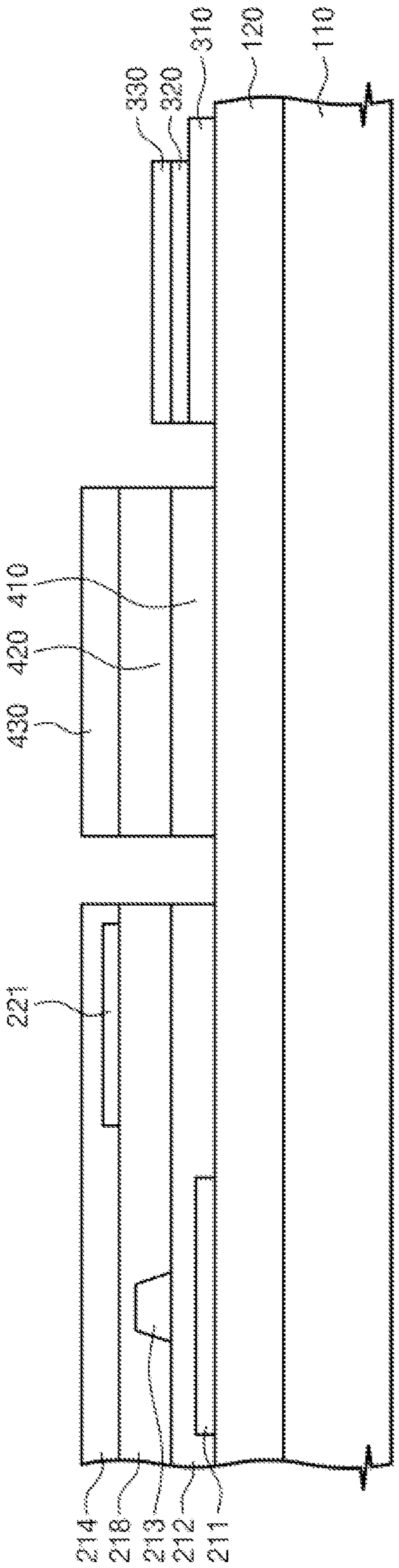

Referring to FIG. 18, an operation of laminating the second channel layer 221 on the first interlayer insulating layer 218 of the pixel light emitting part 200 and an operation of laminating the second semiconductor layer 330 on the first semiconductor layer 320 of the pixel solar cell 300 may be simultaneously performed. Further, referring to FIG. 19, an operation of laminating the second insulating layer 214 on the first interlayer insulating layer 218 of the pixel light emitting part 200 and an operation of laminating the second transparent insulating layer 430 on the first transparent interlayer insulating layer 420 of the pixel-transparent window 400 may be simultaneously performed.

Figure 20:
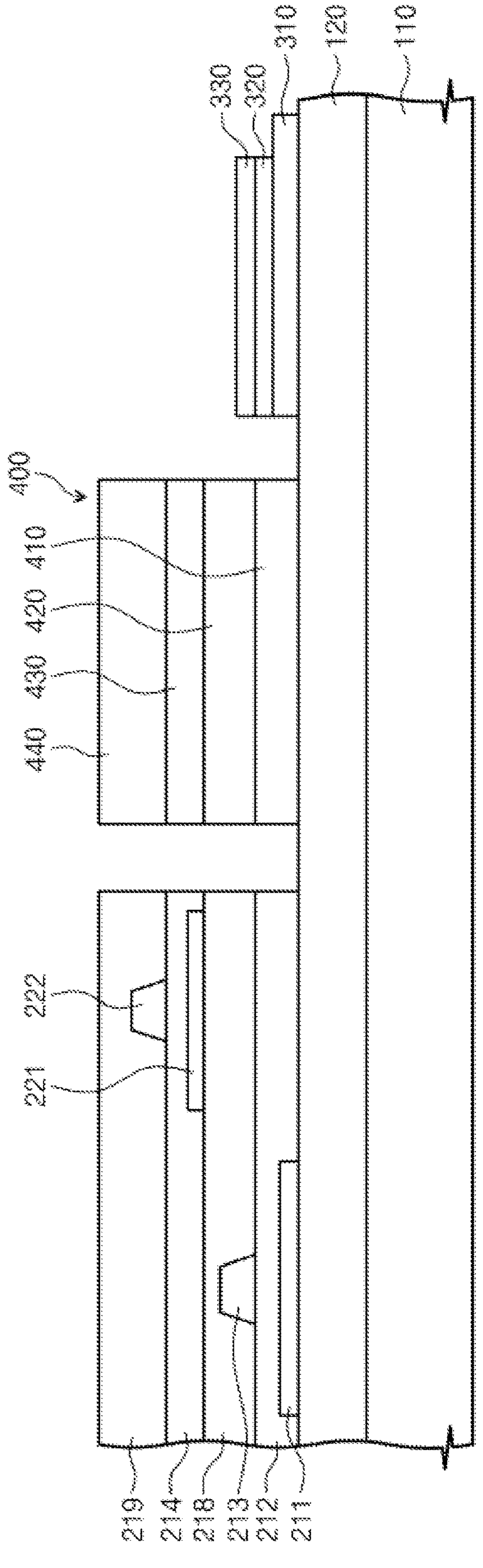

Further, referring to FIG. 20, an operation of laminating the second interlayer insulating layer 219 on the second insulating layer 214 of the pixel light emitting part 200 and an operation of laminating the second transparent interlayer insulating layer 440 on the second transparent insulating layer 430 of the pixel-transparent window 400 may be simultaneously performed. In this way, the pixel light emitting part, the pixel solar cell, and the pixel-transparent window are simultaneously formed, and thus a process of forming the pixel solar cell and the pixel-transparent window may be simplified, and process costs and time may be reduced.

Figure 21:
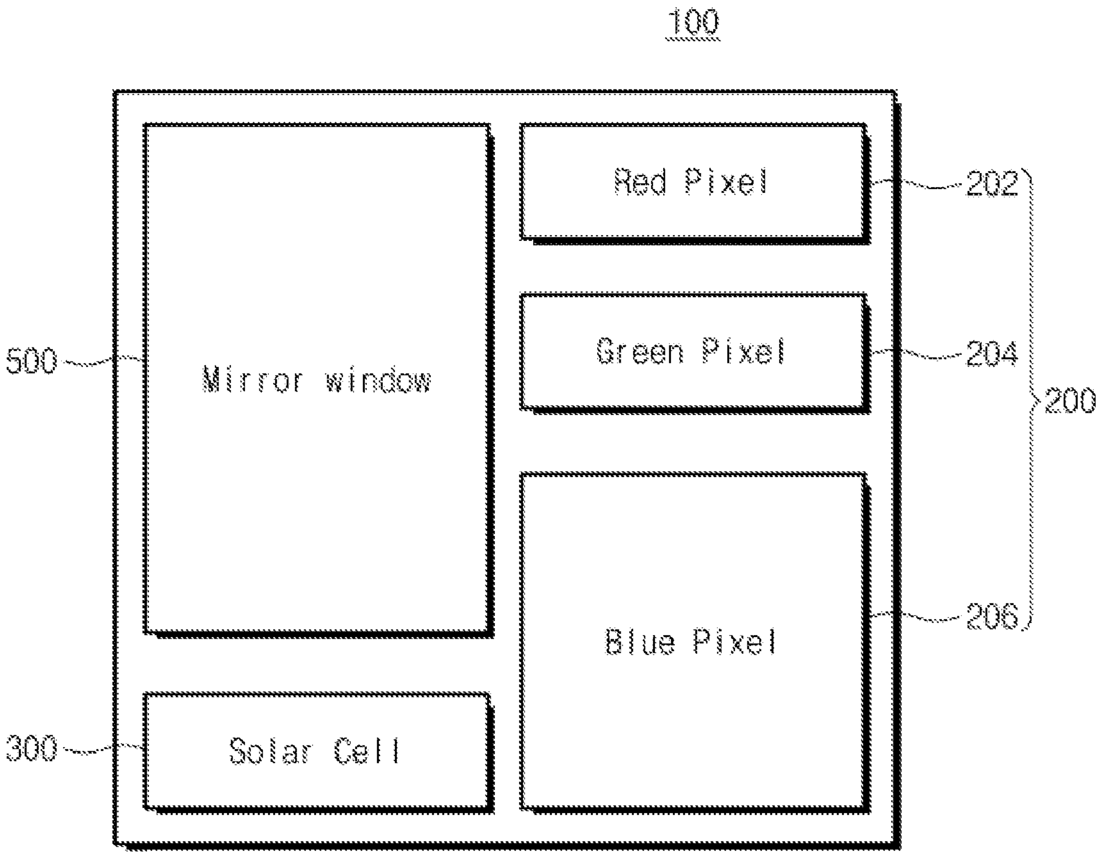
FIG. 21 is a schematic plan view illustrating a single pixel constituting the hybrid OLED display panel according to yet another embodiment of the present disclosure.
Figure 22:
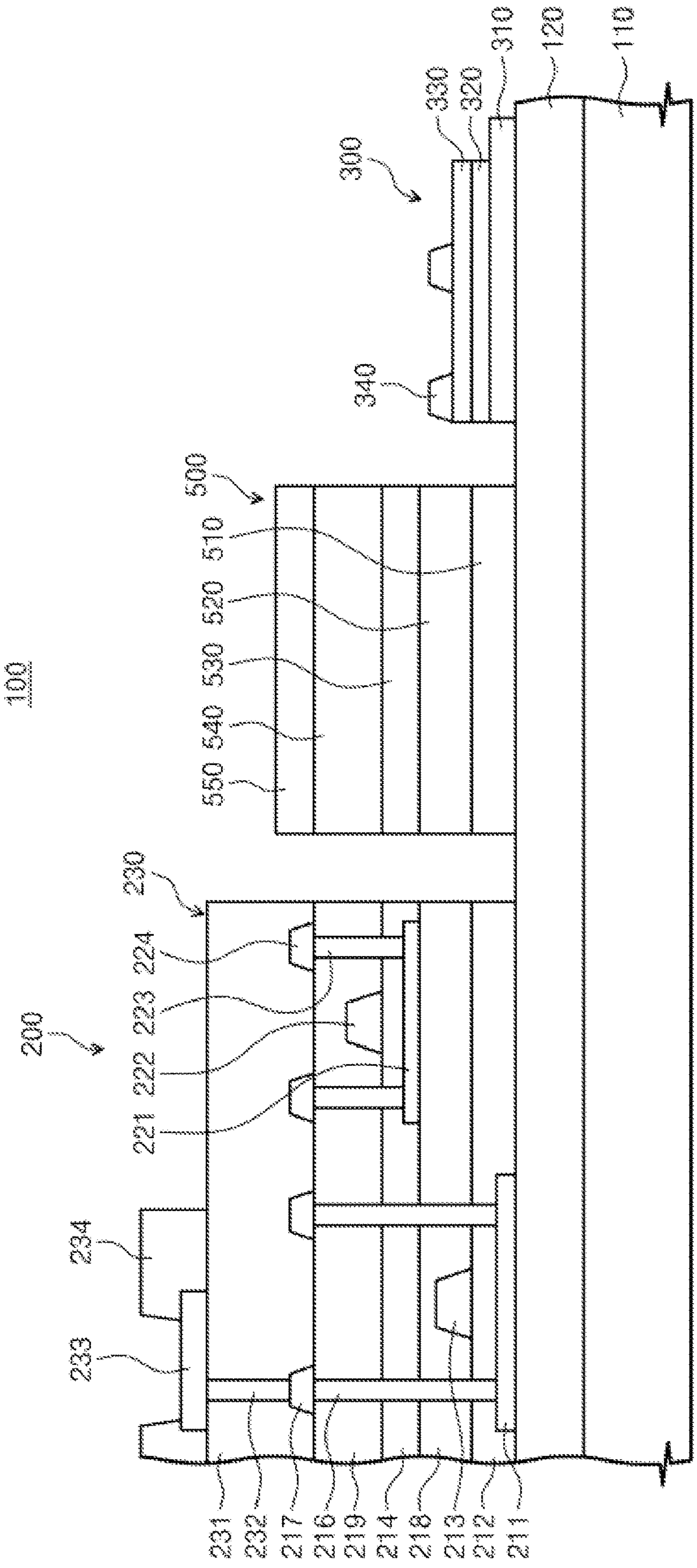
FIG. 22 is a cross-sectional view of the single pixel of the hybrid OLED display panel according to the embodiment of FIG. 21.
Figure 23:
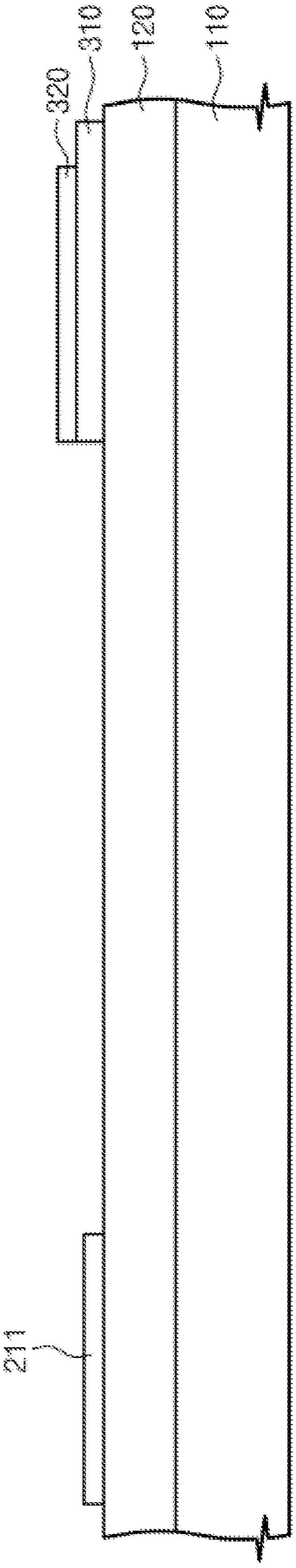
FIGS. 23 to 28 are views for describing a method of manufacturing the hybrid OLED display panel according to the embodiment illustrated in FIG. 22.

FIG. 21 is a schematic plan view illustrating a single pixel constituting the hybrid OLED display panel according to yet another embodiment of the present disclosure. FIG. 22 is a cross-sectional view of the single pixel of the hybrid OLED display panel according to the embodiment of FIG. 21. Referring to FIGS. 21 and 22, the hybrid OLED display panel according to yet another embodiment of the present disclosure differs from the above-described embodiments in that the hybrid OLED display panel further includes a mirror window including a plurality of pixel mirror windows 500 made of a reflective material having excellent reflectivity, such as Ag. Since the pixel light emitting part 200 and the pixel solar cell 300 have been described in the above-described embodiments, a duplicated description thereof will be omitted, and the pixel mirror window 500 will be mainly described.

The plurality of pixel mirror windows 500 may be arranged in the same first array structure as that of the pixel light emitting parts 200 to correspond to the plurality of pixels 100 on the substrate 110. Each of the pixel mirror windows 500 may be arranged in a one-to-one correspondence with the pixel light emitting part 200 within the pixel area defined as the pixel unit. The plurality of pixel light emitting parts 200 and the plurality of pixel mirror windows 500 may be arranged to have the same array period.

The pixel mirror window 500 may be disposed in a fourth area within the pixel area defined as the pixel unit. The fourth area in which the pixel mirror window 500 is disposed may be an area that does not overlap the first area in which the pixel light emitting part 200 is disposed and the second area in which the pixel solar cell 300 is disposed, on a plane of the hybrid OLED display panel.

The pixel mirror window 500 may include a first transparent insulating layer 510 that is laminated on the substrate 110 and the buffer layer 120, a first transparent interlayer insulating layer 520 that is laminated on the first transparent insulating layer 510, a second transparent insulating layer 530 that is laminated on the first transparent interlayer insulating layer 520, a second transparent interlayer insulating layer 540 that is laminated on the second transparent insulating layer 530, and a reflective layer 550 that is laminated on the second transparent interlayer insulating layer 540 and made of a reflective material.

The first insulating layer 212 of the driving thin film transistor 210 and the first transparent insulating layer 510 of the pixel mirror window 500 may be made of the same first insulating material. The second insulating layer 214 of the pixel light emitting part 200 and the second transparent insulating layer 530 of the pixel mirror window 500 may be made of the same second insulating material.

The first interlayer insulating layer 218 of the pixel light emitting part 200 and the first transparent interlayer insulating layer 520 of the pixel mirror window 500 may be made of the same third insulating material. Further, the second interlayer insulating layer 219 of the pixel light emitting part 200 and the second transparent interlayer insulating layer 540 of the pixel mirror window 500 may be made of the same fourth insulating material. The reflective layer 550 may finally be laminated on the inorganic layer using an Ag-based material having high reflectivity, thereby implementing a mirror effect.

FIGS. 23 to 28 are views for describing a method of manufacturing the hybrid OLED display panel according to the embodiment illustrated in FIG. 22. First, referring to FIG. 23, after the first electrode layer 310 of the pixel solar cell 300 is laminated on the substrate 110 and the buffer layer 120, an operation of laminating the first channel layer 211 of the pixel light emitting part 200 and an operation of laminating the first semiconductor layer 320 on the first electrode layer 310 of the pixel solar cell 300 may be simultaneously performed.

Figure 24:
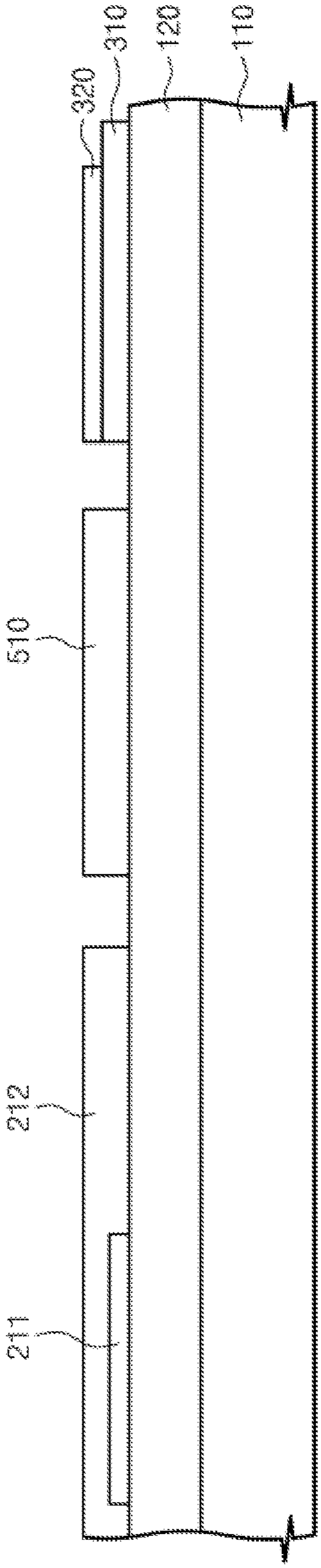
Figure 25:
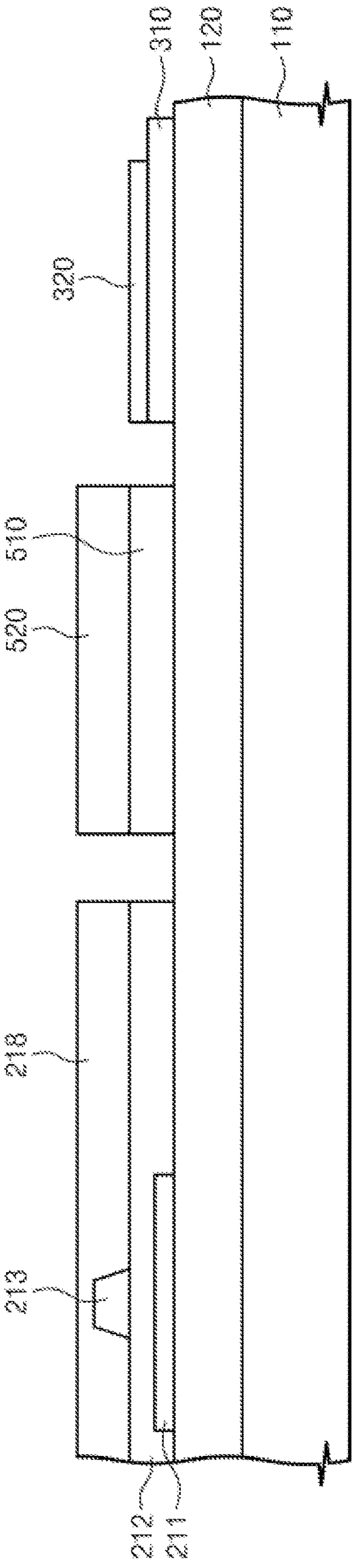

Referring to FIG. 24, an operation of laminating the first insulating layer 212, which covers the first channel layer 211, on the substrate 110 and the buffer layer 120 and an operation of laminating the first transparent insulating layer 510 of the pixel mirror window 500 may be simultaneously performed. Further, referring to FIG. 25, an operation of laminating the first interlayer insulating layer 218 on the first insulating layer 212 of the pixel light emitting part 200 and an operation of laminating the first transparent interlayer insulating layer 520 on the first transparent insulating layer 510 of the pixel mirror window 500 may be simultaneously performed.

Figure 26:
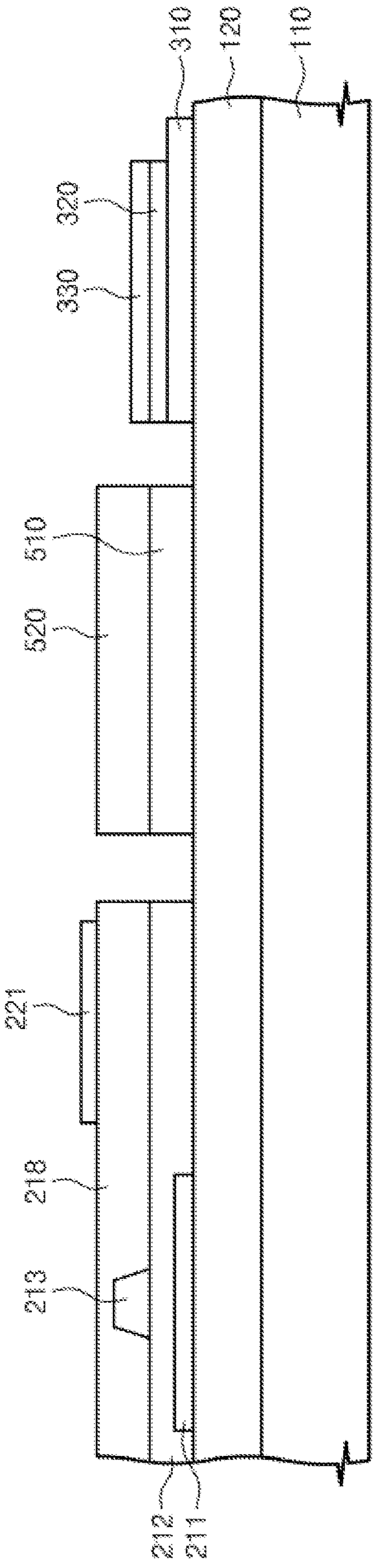
Figure 27:
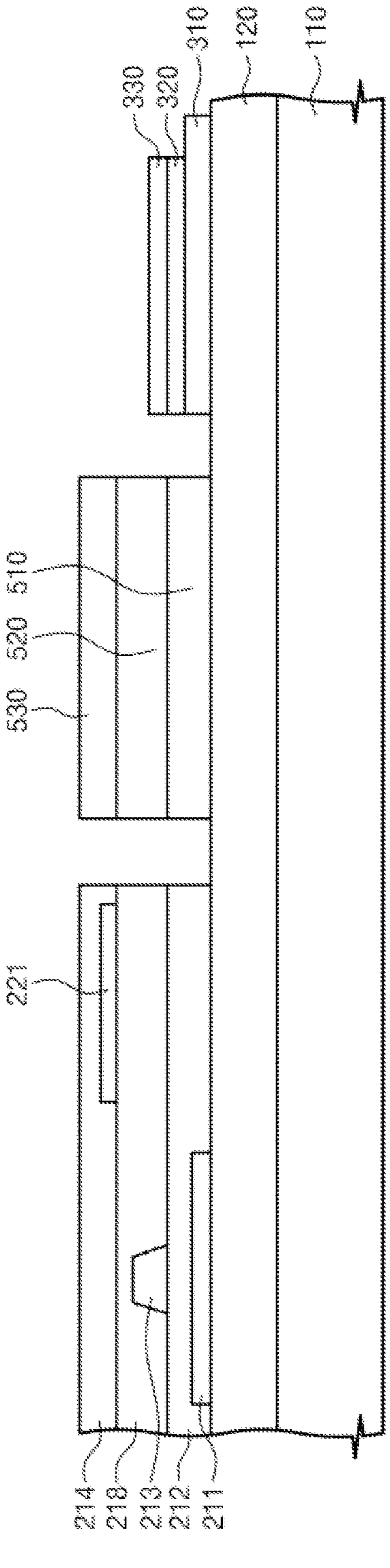

Referring to FIG. 26, an operation of laminating the second channel layer 221 on the first interlayer insulating layer 218 of the pixel light emitting part 200 and an operation of laminating the second semiconductor layer 330 on the first semiconductor layer 320 of the pixel solar cell 300 may be simultaneously performed. Further, referring to FIG. 27, an operation of laminating the second insulating layer 214 on the first interlayer insulating layer 218 of the pixel light emitting part 200 and an operation of laminating the second transparent insulating layer 530 on the first transparent interlayer insulating layer 520 of the pixel mirror window 500 may be simultaneously performed.

Figure 28:
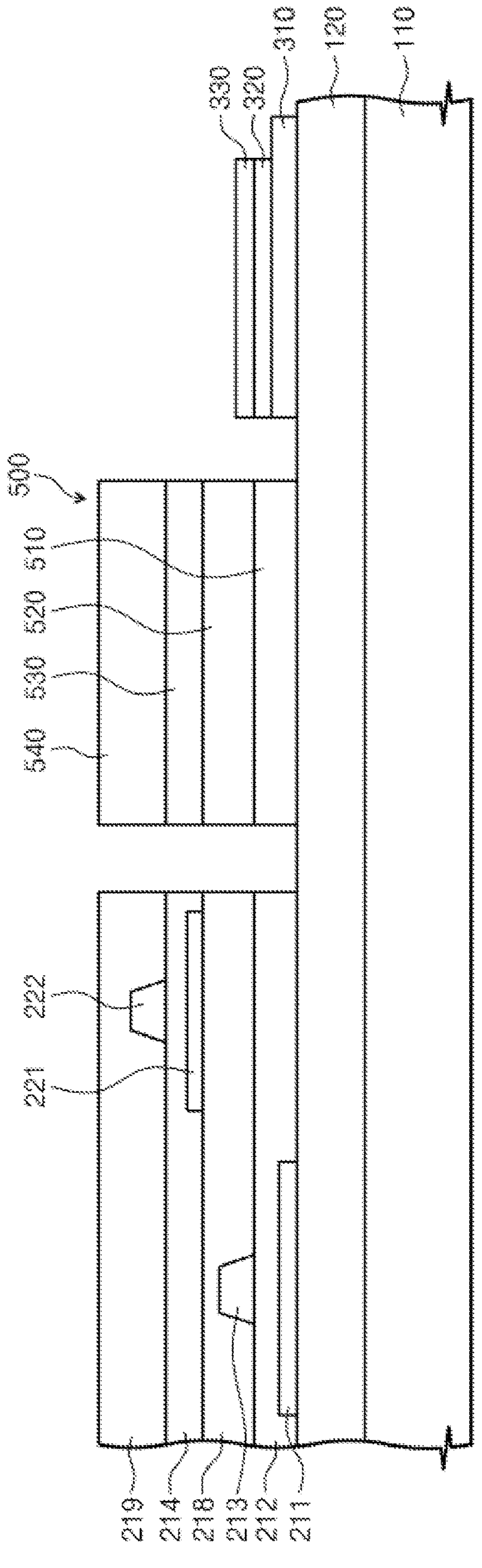

Further, referring to FIG. 28, an operation of laminating the second interlayer insulating layer 219 on the second insulating layer 214 of the pixel light emitting part 200 and an operation of laminating the second transparent interlayer insulating layer 540 on the second transparent insulating as layer 530 of the pixel mirror window 500 may be simultaneously performed. In this way, the pixel light emitting part, the pixel solar cell, and the pixel mirror window are simultaneously formed, and thus a process of forming the pixel solar cell and the pixel mirror window may be simplified, and process costs and time may be reduced.

Figure 29:
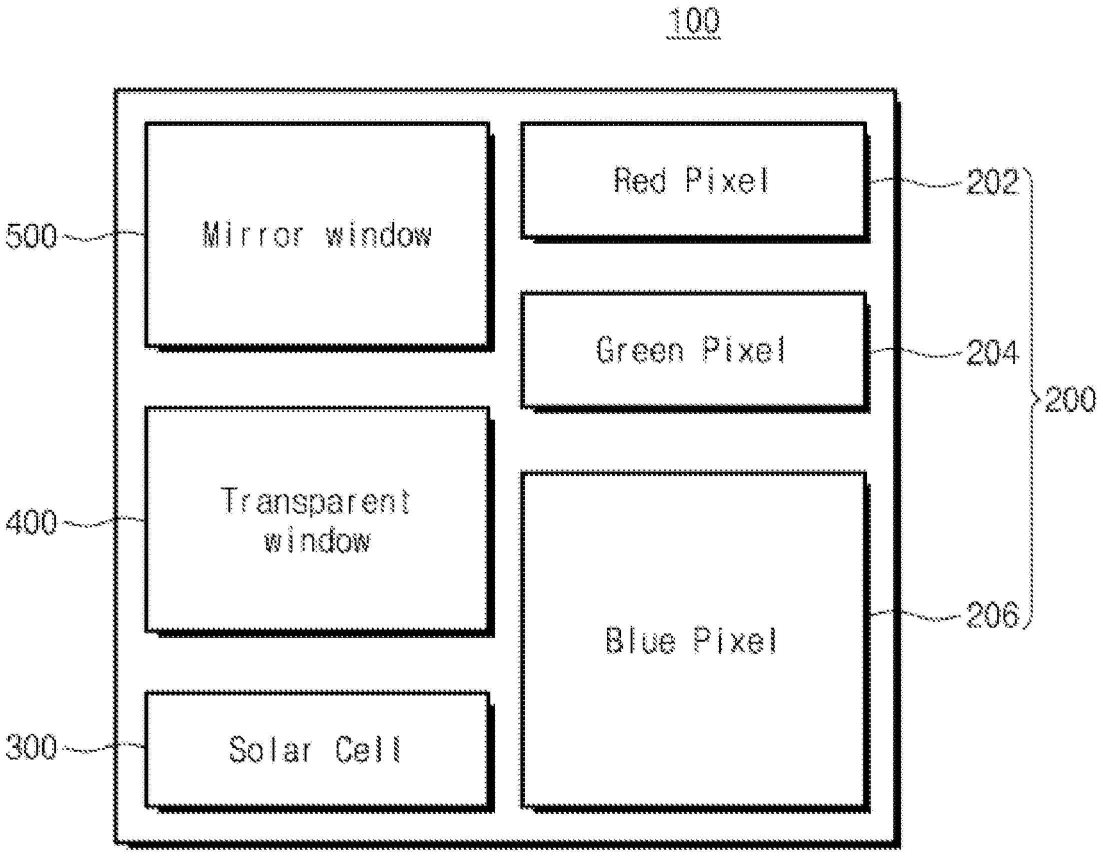
FIG. 29 is a schematic plan view illustrating the single pixel constituting the hybrid OLED display panel according to yet another embodiment of the present disclosure.
Figure 30:
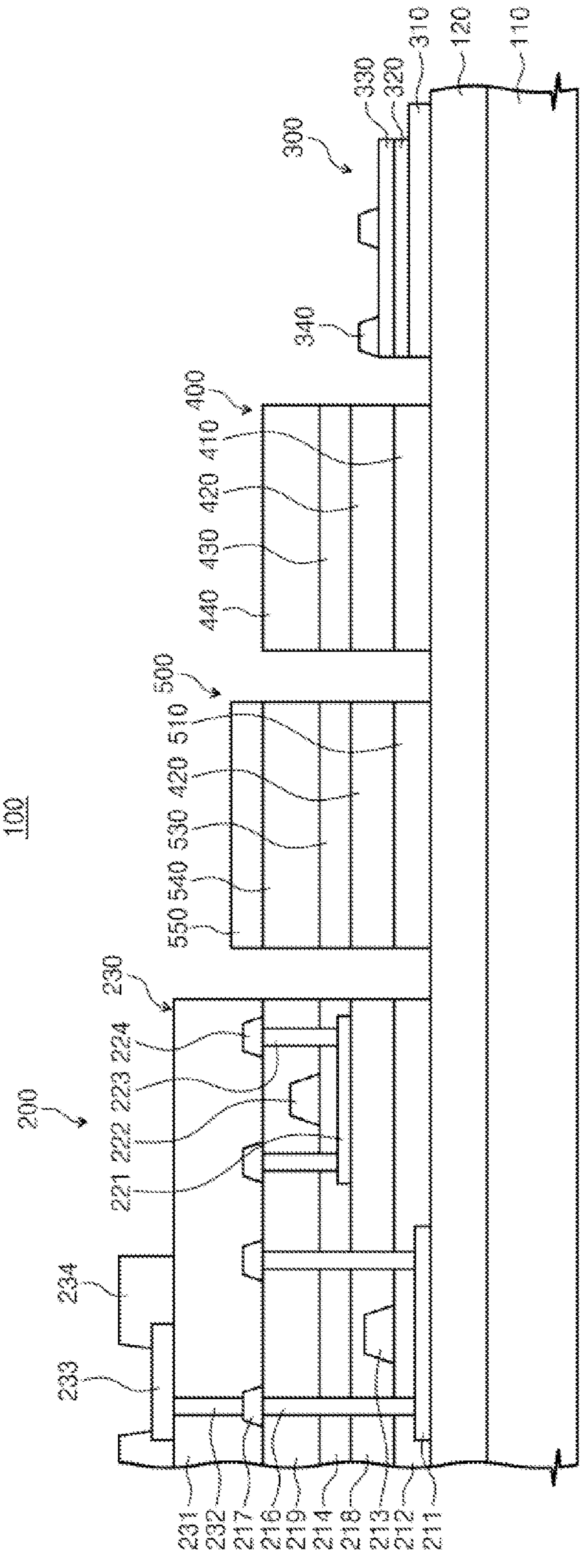
FIG. 30 is a cross-sectional view of the single pixel of the hybrid OLED display panel according to the embodiment of FIG. 29.

FIG. 29 is a schematic plan view illustrating the single pixel constituting the hybrid OLED display panel according to yet another embodiment of the present disclosure. FIG. 30 is a cross-sectional view of the single pixel of the hybrid OLED display panel according to the embodiment of FIG. 29. Referring to FIGS. 29 and 30, the hybrid OLED display panel according to yet another embodiment of the present disclosure differs from the above-described embodiment in that each of the pixels includes all the pixel light emitting part 200, the pixel solar cell 300, the pixel-transparent window 400, and the pixel mirror window 500. Since the pixel light emitting part 200, the pixel solar cell 300, the pixel-transparent window 400, and the pixel mirror window 500 have been described through the above-described embodiments, duplicated descriptions thereof will be omitted.

According to an embodiment of FIGS. 29 and 30, a display may be implemented using the plurality of pixel light emitting part 200 of the hybrid OLED display panel, a display panel having both mirror characteristics and transparent window characteristics may be provided, and at the same time, solar energy may be collected using the plurality of pixel solar cells 300.

The hybrid OLED display panel according to an embodiment of the present disclosure may be applied to various display panels such as an OLED display, a flexible OLED display, a rollable OLED display, and a TFT-LED.

The above detailed description exemplifies the present disclosure. Furthermore, the above-mentioned contents describe the embodiments of the present disclosure, and the present disclosure may be used in various other combinations, changes, and environments. That is, the present disclosure may be modified and corrected without departing from the scope of the present disclosure that is disclosed in the specification, the equivalent scope to the written disclosures, and/or the technical or knowledge range of those skilled in the art.

The written embodiment describes the best state for implementing the technical spirit of the present disclosure, and various changes required in the detailed application fields and purposes of the present disclosure may be made. Thus, the above detailed description of the present disclosure is not intended to restrict the present disclosure in an embodiment. Furthermore, it should be construed that the appended claims include an embodiment.

The invention claimed is:

1. A hybrid organic light emitting diode (OLED) display panel comprising:

an OLED panel including a plurality of pixels arranged in a predetermined first array structure on a substrate, wherein each of the plurality of pixels includes a pixel light emitting part, and wherein the pixel light emitting part includes an OLED, a driving thin film transistor configured to drive the OLED, and a switching thin film transistor configured to switch the driving thin film transistor;

a solar cell including a plurality of pixel solar cells arranged in the first array structure to correspond to the plurality of pixels on the substrate, wherein each of the plurality of pixel solar cells is disposed to correspond to the pixel light emitting part within a pixel area set as a pixel unit; and a mirror window including a plurality of pixel mirror windows made of a reflective material and arranged in the first array structure to correspond to the plurality of pixels on the substrate, wherein each of the plurality of pixel mirror windows is disposed in a one-to-one correspondence with the pixel light emitting part within the pixel area, wherein the pixel light emitting part is disposed in a first area within the pixel area, wherein the pixel solar cell is disposed in a second area corresponding to a corner area within the pixel area, wherein the second area is an area that does not overlap with the first area on a plane of the hybrid OLED display panel, wherein the driving thin film transistor includes a first channel layer on the substrate, a first gate layer formed to be insulated on the first channel layer, and a first drain electrode and a first source electrode electrically connected to the first channel layer, wherein the pixel solar cell includes a first electrode layer on the substrate, a first semiconductor layer laminated on the first electrode layer, a second semiconductor layer laminated on the first semiconductor layer in a heterojunction structure, and a second electrode layer laminated on the second semiconductor layer, and wherein the first channel layer and the first semiconductor layer are made of the same first semiconductor material corresponding to a first type that is one of an N-type and a P-type.

2. The hybrid OLED display panel of claim 1, wherein the plurality of pixel light emitting parts and the plurality of pixel solar cells provided in the plurality of pixels are arranged to have the same array period.

3. The hybrid OLED display panel of claim 1, wherein the switching thin film transistor includes a second channel layer on the substrate, a second gate layer formed to be insulated on the second channel layer, and a second drain electrode and a second source electrode electrically connected to the second channel layer, and wherein the second channel layer and the second semiconductor layer are made of the same second semiconductor material corresponding to a second type that is the other one of the N-type and the P-type.

4. The hybrid OLED display panel of claim 3, further comprising:

a transparent window including a plurality of pixel-transparent windows arranged in the first array structure to correspond to the plurality of pixels on the substrate, wherein each of the plurality of pixel-transparent windows is disposed in a one-to-one correspondence with the pixel light emitting part within the pixel area.

5. The hybrid OLED display panel of claim 4, wherein the plurality of pixel light emitting parts and the plurality of pixel-transparent windows are arranged to have the same array period, wherein the pixel-transparent window is disposed in a third area within the pixel area, and wherein the third area is an area that does not overlap with the first area and the second area on a plane of the hybrid OLED display panel.

6. The hybrid OLED display panel of claim 5, wherein the driving thin film transistor further includes a first insulating layer laminated on the first channel layer, a first interlayer insulating layer covering the first gate layer, a second insulating layer laminated on the first interlayer insulating layer, and a second interlayer insulating layer formed on the second insulating layer, wherein the second channel layer is laminated on the first interlayer insulating layer, wherein the second gate layer is formed on the second insulating layer, wherein the second interlayer insulating layer covers the second gate layer, wherein the pixel-transparent window includes a first transparent insulating layer laminated on the substrate, a first transparent interlayer insulating layer laminated on the first transparent insulating layer, a second transparent insulating layer laminated on the first transparent interlayer insulating layer, and a second transparent interlayer insulating layer laminated on the second transparent insulating layer, wherein the first insulating layer and the first transparent insulating layer are made of the same first insulating material, wherein the second insulating layer and the second transparent insulating layer are made of the same second insulating material, wherein the first interlayer insulating layer and the first transparent interlayer insulating layer are made of the same third insulating material, and wherein the second interlayer insulating layer and the second transparent interlayer insulating layer are made of the same fourth insulating material.

7. The hybrid OLED display panel of claim 1, wherein the plurality of pixel light emitting parts and the plurality of pixel mirror windows are arranged to have the same array period, wherein the pixel mirror window is disposed in a fourth area within the pixel area, and wherein the fourth area is an area that does not overlap with the first area and the second area on a plane of the hybrid OLED display panel.

8. A method of manufacturing a hybrid OLED display panel, the method comprising:

forming an OLED panel including a plurality of pixels arranged in a first array structure on a substrate;

forming a solar cell including a plurality of pixel solar cells arranged in the first array structure to correspond to the plurality of pixels on the substrate; and forming a mirror window made of a reflective material to dispose each of a plurality of pixel mirror windows in a one-to-one correspondence with the pixel light emitting part within the pixel area, wherein the forming of the OLED panel includes forming the OLED panel to include a pixel light emitting part for each of the plurality of pixels, wherein the pixel light emitting part includes an OLED, a driving thin film transistor configured to drive the OLED, and a switching thin film transistor configured to switch the driving thin film transistor, wherein the forming of the solar cell includes forming the solar cell to dispose each of the plurality of pixel solar cells to correspond to the pixel light emitting part within a pixel area set as a pixel unit, and wherein the plurality of pixel mirror windows are arranged in the first array structure to correspond to the plurality of pixels on the substrate.

9. The method of claim 8, wherein the forming of the OLED panel includes forming the driving thin film transistor on the substrate, wherein the forming of the driving thin film transistor includes:

laminating a first channel layer on the substrate;

forming a first gate layer to be insulated on the first channel layer; and forming a first drain electrode and a first source electrode to be electrically connected to the first channel layer, wherein the forming of the solar cell includes:

laminating a first electrode layer on the substrate;

laminating a first semiconductor layer on the first electrode layer;

laminating a second semiconductor layer on the first semiconductor layer in a heterojunction structure; and laminating a second electrode layer on the second semiconductor layer, and wherein the first channel layer and the first semiconductor layer are made of the same first semiconductor material corresponding to a first type that is one of an N-type and a P-type.

10. The method of claim 9, wherein the forming of the OLED panel further includes forming the switching thin film transistor on the substrate, wherein the forming of the switching thin film transistor includes:

laminating a second channel layer on the substrate;

forming a second gate layer to be insulated on the second channel layer; and forming a second drain electrode and a second source electrode to be electrically connected to the second channel layer, and wherein the second channel layer and the second semiconductor layer are made of the same second semiconductor material corresponding to a second type that is the other one of the N-type and the P-type.

11. The method of claim 10, wherein the laminating of the first channel layer and the laminating of the first semiconductor layer are simultaneously performed, and wherein the laminating of the second channel layer and the laminating of the second semiconductor layer are simultaneously performed.

12. The method of claim 10, further comprising:

forming a transparent window to dispose each of a plurality of pixel-transparent windows in a one-to-one correspondence with the pixel light emitting part within the pixel area, and wherein the plurality of pixel-transparent windows are arranged in the first array structure to correspond to the plurality of pixels on the substrate.

13. The method of claim 12, wherein the forming of the driving thin film transistor further includes:

laminating a first insulating layer on the first channel layer;

laminating a first interlayer insulating layer covering the first gate layer;

laminating a second insulating layer on the first interlayer insulating layer; and laminating a second interlayer insulating layer on the second insulating layer, wherein the second channel layer is laminated on the first interlayer insulating layer, wherein the second gate layer is formed on the second insulating layer, wherein the second interlayer insulating layer is formed to cover the second gate layer, wherein the forming of the transparent window includes:

laminating a first transparent insulating layer on the substrate;

laminating a first transparent interlayer insulating layer on the first transparent insulating layer;

laminating a second transparent insulating layer on the first transparent interlayer insulating layer; and laminating a second transparent interlayer insulating layer on the second transparent insulating layer, wherein the first insulating layer and the first transparent insulating layer are made of the same first insulating material, wherein the second insulating layer and the second transparent insulating layer are made of the same second insulating material, wherein the first interlayer insulating layer and the first transparent interlayer insulating layer are made of the same third insulating layer, and wherein the second interlayer insulating layer and the second transparent interlayer insulating layer are made of the same fourth insulating layer.

14. The method of claim 13, wherein the laminating of the first insulating layer and the laminating of the first transparent insulating layer are simultaneously performed, wherein the laminating of the second insulating layer and the laminating of the second transparent insulating layer are simultaneously performed, wherein the laminating of the first interlayer insulating layer and the laminating of the first transparent interlayer insulating layer are simultaneously performed, and wherein the laminating of the second interlayer insulating layer and the laminating of the second transparent interlayer insulating layer are simultaneously performed.

* * * * *